(12) United States Patent
Yu

(10) Patent No.: US 12,489,407 B2
(45) Date of Patent: Dec. 2, 2025

(54) AMPLIFIER CIRCUIT WITH A CURRENT SOURCE

(71) Applicant: Intel Corporation, Santa Clara, CA (US)

(72) Inventor: Chuanzhao Yu, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1016 days.

(21) Appl. No.: 17/355,203

(22) Filed: Jun. 23, 2021

(65) Prior Publication Data

US 2022/0416733 A1 Dec. 29, 2022

(51) Int. Cl.
*H03F 3/195* (2006.01)
*H03F 1/02* (2006.01)
*H03F 3/24* (2006.01)

(52) U.S. Cl.
CPC .......... *H03F 3/195* (2013.01); *H03F 1/0227* (2013.01); *H03F 3/245* (2013.01); *H03F 2200/451* (2013.01)

(58) Field of Classification Search
CPC ........ H03F 3/195; H03F 3/245; H03F 1/0227; H03F 2200/45
USPC ....................................................... 330/295
See application file for complete search history.

(56) References Cited

U.S. PATENT DOCUMENTS

| | | | | |
|---|---|---|---|---|
| 8,228,122 B1* | 7/2012 | Yuen | ...................... | H03F 3/195 330/285 |
| 9,958,891 B1* | 5/2018 | Furth | ...................... | G05F 1/575 |
| 10,361,696 B1* | 7/2019 | Schleicher | ........... | H03K 17/161 |
| 11,159,086 B2* | 10/2021 | Phillips | ................. | H02M 3/158 |
| 2002/0089860 A1* | 7/2002 | Kashima | ............... | H02M 3/156 363/13 |
| 2005/0002316 A1* | 1/2005 | Maruyama | ................ | H03F 3/08 369/116 |
| 2008/0180167 A1* | 7/2008 | Christian | ................ | H03F 3/217 330/10 |
| 2010/0182808 A1* | 7/2010 | Sato | .................. | H02M 3/33592 363/21.18 |
| 2017/0359038 A1* | 12/2017 | Tanaka | ..................... | H03F 3/005 |
| 2019/0181764 A1* | 6/2019 | Pentakota | ............... | H01L 25/18 |

* cited by examiner

*Primary Examiner* — Andrea Lindgren Baltzell
(74) *Attorney, Agent, or Firm* — Viering, Jentschura & Partner mbB

(57) ABSTRACT

Amplifier circuits, radio communication circuits, radio communication devices, and methods provided in this disclosure. The amplifier circuit may include an amplifier configured to amplify an input signal to provide an output signal. The output signal of the amplifier may include a direct current (DC) signal. The amplifier circuit may further include a current source coupled to the amplifier. The current source may be configured to receive an electrical supply. The current source may further be configured to divide the direct current (DC) signal of the output signal based on the electrical supply.

25 Claims, 11 Drawing Sheets

AMPLIFIER CIRCUIT WITH A CURRENT SOURCE

TECHNICAL FIELD

This disclosure generally relates to an amplifier circuit, a radio communication circuit, a radio communication device, and a method.

BACKGROUND

The communication devices communicate by transmitting and receiving communication signals to exchange information. Transmitters of radio communication devices should in principal be able to transmit the radio communication signals with the necessary power so that the transmitter can deliver the radio communication signals properly to a corresponding receiver that is going to receive the radio communication signal Amplifiers are traditionally used to increase the power of radio communication signals in radio communication devices. A transmitter and/or a receiver may include one or more amplifiers to provide the amplification to increase the power of the communication signal that is to be transmitted or received.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various aspects of the disclosure are described with reference to the following drawings, in which.

DESCRIPTION

Figure 1:
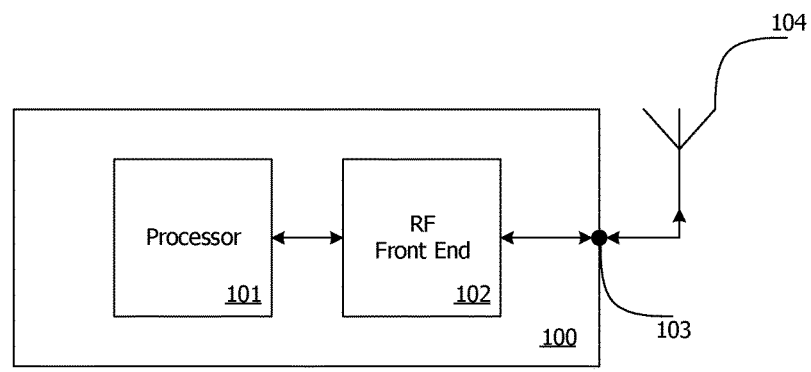
FIG. 1 shows schematically a block diagram of an example of a radio communication device.

The following detailed description refers to the accompanying drawings that show, by way of illustration, exemplary details and aspects in which aspects of the present disclosure may be practiced.

Amplifiers are traditionally used to increase the power of a communication signal, and a transmitter and/or a receiver may include one or more amplifiers to provide the amplification to increase the power of the communication signal that is to be transmitted or received. The design of such amplifiers may be challenging, especially considering market demands to increase bandwidth by various methods, such as wideband radio communication signals, the wide adaptation of radio communication with frequency channels over 1 GHz, and millimeter-wave, that introduce further challenges especially in terms of amplifier gain, linearity, power efficiency, and power consumption. Accordingly, it may be desirable to develop an amplifier that may address at least one of these challenges.

In general, the essential task performed by an amplifier is to increase the power of a signal, however, there are many considerations that should have been taken to provide the amplification with an amplifier, such as the "linearity" of the amplifier, which is sometimes referred as "fidelity" based on the type of the amplifier. The term refers to provide the amplification to the input signal without changing the characteristics of the input signal, for example, based on the frequency and amplitude of a component of the input signal. An ideal amplifier would provide the same amplification (i.e. with the same gain) for every component of the input signal in terms of linearity.

There are further concerns that may be of similar importance as the linearity for the amplifiers, such as the gain of the amplifier, the output power provided by the amplifier, the bandwidth which the amplifier is intended to operate, the efficiency of the amplifier in terms of power (i.e., power efficiency), impedance matching, and the amount of power dissipated by heat. Accordingly, an amplifier should meet certain expectations for various aspects based on the conditions in which the amplifier is intended to operate.

Exemplarily, low-noise amplifiers (LNA) are used in telecommunication by communication devices to amplify a very low-power signal without introducing any degradation to the signal-to-noise ratio (SNR) of the input signal at very low power. It is generally unavoidable introducing any noise when amplifying a signal, and an input signal at very low power may be particularly susceptible to the noise. Accordingly, low-noise amplifiers are designed to minimize the noise that is introduced by the amplifier using various methods. For example, receivers of radio communication signals usually include low noise amplifiers to amplify received signals which may be at very low power levels.

Further, power amplifiers are commonly used in telecommunication by communication devices, which are designed primarily to increase the power available to a load that allows maximum voltage and/or current swing, and in particular radio frequency (RF) power amplifiers that are provided to convert a low-power radio frequency (RF) signal and optimizing impedances for power transfer into a higher power signal to be transmitted by an antenna. The radio frequency (RF) power amplifiers generally include solid-state devices, mainly metal-oxide-semiconductor field-effect-transistors (MOSFET).

Exemplarily, various methods are used to increase the output power of a power amplifier, that may include increasing the size of the communication device periphery, which would provide challenges regarding impedance matching in a manner that may prevent power efficient applications, and/or concerns with respect to form-factor of the devices including such power amplifiers.

Alternatively, a plurality of amplifiers may be combined in a manner that multiple amplifiers providing amplification to an input signal to increase the output power and load impedance of the power amplifier simultaneously. Exemplarily, the plurality of amplifiers may include stacked power amplifiers which are coupled together to provide a collective amplification. Stacked power amplifiers may be more reliable than providing the same amount of amplification using one single amplifier, however, the distortion of stacked amplifiers, or stacked amplifier stages, may degrade the linearity performance of the amplifier.

In various examples, an amplifier, or an amplifier circuit, may include one or more stacked stages coupled to a transconductance amplifier. Transconductance amplifiers supplied by direct current (DC) voltage may be configured to provide direct current (DC) at relatively high levels to boost the gain and linearity, which may result in increased static and dynamic currents in the one or more stacked stages coupled to the transconductance amplifier. Additionally, the differences of the envelope signals at the one or more stacked stages, at the drain, gate, or source terminals of one or more metal-oxide-semiconductor field-effect-transistors (MOSFET) of the stacked stages may provide challenges in terms of linearity of the one or more metal-oxide-semiconductor field-effect-transistors (MOSFET), which may result in degraded linearity.

In various examples, the output signal of an amplifier may include a direct current (DC) portion which is provided by an electrical supply, such as a supply voltage, and carrying out the direct current (DC) portion to a further amplifier, such as a further amplifier in a stacked configuration. In particular, a direct current (DC) current at high levels in a common source stage may increase direct current (DC) power consumption and reduce the efficiency of the amplifier.

The following detailed description refers to the accompanying drawings that show, by way of illustration, specific details and aspects in which the disclosure may be practiced.

The word "exemplary" is used herein to mean "serving as an example, instance, or illustration". Any aspect or design described herein as "exemplary" is not necessarily to be construed as preferred or advantageous over other aspects or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one. The terms "proper subset", "reduced subset", and "lesser subset" refer to a subset of a set that is not equal to the set, i.e. a subset of a set that contains fewer elements than the set.

The term "transistor" used in accordance with this disclosure may be any kind of transistor including N-type metal-oxide semiconductors (NMOS), P-type metal-oxide semiconductors, bipolar junction transistors (BJT), field-effect transistors (FET), junction-field effect transistors (JFET), metal oxide semiconductor field-effect transistors (MOSFET), etc. The one or more transistors may include complementary metal-oxide semiconductors (CMOS) or any other similar complementary structures. The terminals of the transistors used in accordance with the disclosure may refer to field-effect transistors (FET), such as they include a gate terminal, a source terminal, and a drain terminal. The skilled person would know that in case of an adaptation to another type of transistor, the terminal names may be different.

The term "amplifier" utilized herein refers to any type of component, circuit, module, or device which amplifies (i.e. increase power/amplitude) an input signal and may provide an amplified signal as an output signal. The amplifier may be any type of amplifier, an amplifier stack, or an amplifier stage.

The term "electrical supply" utilized herein refers to any means to provide electrical power. The term may correspond to an electrical current, and/or electrical voltage.

As used herein, "memory" is understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory, and thus may refer to a collective component including one or more types of memory. Any single memory component may be separated into multiple collectively equivalent memory components, and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

The term "radio communication device" utilized herein refers to any devices using radio frequency signals for communication including user-side devices (both portable and fixed) that can connect to a core network and/or external data networks via a radio access network. "Radio communication device" can include any mobile or immobile wireless communication device, including User Equipment (UEs), Mobile Stations (MSs), Stations (STAs), cellular phones, tablets, laptops, personal computers, wearables, multimedia playback, and other handheld or body-mounted electronic devices, consumer/home/office/commercial appliances, vehicles, and any other electronic device capable of user-side wireless communications. Without loss of generality, in some cases terminal devices can also include application-layer components, such as application processors or other general processing components that are directed to functionality other than wireless communications. Radio communication devices can optionally support wired communications in addition to wireless communications. Furthermore, radio communication devices can include vehicular communication devices that function as radio communication devices.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples. As used herein, a first radio communication technology may be different from a second radio communication technology if the first and second radio communication technologies are based on different communication standards.

Aspects described herein may use such radio communication technologies according to various spectrum management schemes, including, but not limited to, dedicated licensed spectrum, unlicensed spectrum, (licensed) shared spectrum (such as LSA, "Licensed Shared Access," in 2.3-2.4 GHz, 3.4-3.6 GHz, 3.6-3.8 GHz and further frequencies and SAS, "Spectrum Access System," in 3.55-3.7 GHz and further frequencies), and may be use various spectrum bands including, but not limited to, IMT (International Mobile Telecommunications) spectrum (including 450-470 MHz, 790-1060 MHz, 1710-2025 MHz, 2110-2200 MHz, 2300-2400 MHz, 2500-2690 MHz, 698-790 MHz, 610-790 MHz, 3400-3600 MHz, etc., where some bands may be limited to specific region(s) and/or countries), IMT-advanced spectrum, IMT-2020 spectrum (expected to include 3600-3800 MHz, 3.5 GHz bands, 700 MHz bands, bands within the 24.25-86 GHz range, etc.), spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 64-71 GHz, 71-76 GHz, 81-86 GHz and 102-104 GHz, etc.), the ITS (Intelligent Transport Systems) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), the 70.2 GHz-71 GHz band, any band between 65.88 GHz and 71 GHz, bands currently allocated to automotive radar applications such as 76-81 GHz, and future bands including 104-300 GHz and above.

For purposes of this disclosure, radio communication technologies may be classified as one of a Short-Range radio communication technology or Cellular Wide Area radio communication technology. Short Range radio communication technologies may include Bluetooth, WLAN (e.g., according to any IEEE 802.11 standard), and other similar radio communication technologies. Cellular Wide Area radio communication technologies may include Global System for Mobile Communications (GSM), Code Division Multiple Access 2000 (CDMA2000), Universal Mobile Telecommunications System (UMTS), Long Term Evolution (LTE), General Packet Radio Service (GPRS), Evolution-Data Optimized (EV-DO), Enhanced Data Rates for GSM Evolution (EDGE), High Speed Packet Access (HSPA; including High Speed Downlink Packet Access (HSDPA), High Speed Uplink Packet Access (HSUPA), HSDPA Plus (HSDPA+), and HSUPA Plus (HSUPA+)), Worldwide Interoperability for Microwave Access (WiMax) (e.g., according to an IEEE 802.16 radio communication standard, e.g., WiMax fixed or WiMax mobile), etc., and other similar radio communication technologies. Cellular Wide Area radio communication technologies also include "small cells" of such technologies, such as microcells, femtocells, and picocells. Cellular Wide Area radio communication technologies may be generally referred to herein as "cellular" communication technologies.

The terms "radio communication network," "wireless network", "communication network," or the like, as utilized herein encompasses both an access section of a network (e.g., a radio access network (RAN) section) and a core section of a network (e.g., a core network section).

Unless explicitly specified, the term "transmit" encompasses both direct (point-to-point) and indirect transmission (via one or more intermediary points). Similarly, the term "receive" encompasses both direct and indirect reception.

Furthermore, the terms "transmit", "receive", "communicate", and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as radio frequency (RF) transceivers and antennas, and the logical transmission and reception over the software-level connection is performed by the processors or controllers. The term "communicate" may encompass one or both of transmitting and receiving, i.e., unidirectional or bidirectional communication in one or both of the incoming and outgoing directions. The term "calculate" may encompass both 'direct' calculations via a mathematical expression/formula/relationship and 'indirect' calculations via lookup or hash tables and other array indexing or searching operations.

FIG. 1 shows schematically a block diagram of an example of a radio communication device 100. The radio communication device 100 includes a processor 101. A radio frequency (RF) front end 102 is coupled to the processor 101 and an antenna port 103. The antenna port 103 may be coupled to an antenna 104. The communication device 100 may include a plurality of processors, a plurality of radio frequency (RF) front ends, a plurality of antenna ports, and a plurality of antennas.

For transmitting function, the processor 101 provides signals to be transmitted to the radio frequency (RF) front end 102. The radio frequency (RF) front end 102 may receive the signals from the processor 101. The radio frequency (RF) front end 102 provides the radio frequency (RF) communication signals to the antenna port 103 so that the antenna 104 receives the radio frequency (RF) communication signals from the antenna port 103 and transmits the radio communication signals. Exemplarily, the radio frequency (RF) front end 102 may include an upconverter to convert received signals to the radio frequency (RF) communication signals. The radio frequency (RF) front end 102 includes a power amplifier.

For receiving function, the antenna port 103 receives radio frequency (RF) communication signals from the antenna 104. The radio frequency (RF) front end 102 receives the radio frequency (RF) communication signals from the antenna port 103. The radio frequency (RF) front end may 102 include a downconverter to convert the radio frequency (RF) communication signals. The radio frequency (RF) front end 102 provides its output to the processor 101 which may receive baseband communication signals and decode the baseband communication signals.

The radio communication device 100 is only provided as an example of a radio communication device capable of performing both a transmitting function and a receiving function. A radio communication device may exemplarily be capable of performing only one of these functions (i.e. as a receiver or transmitter), and various aspects provided with this disclosure may apply in these examples as well.

The radio communication device 100 may communicate with a radio communication network, or other radio communication devices and/or network access nodes. Although the communication may take place in compliant with certain examples described herein which refer to a particular radio access network context (e.g., WLAN/WiFi, 5G, NR, LTE, or other 3rd Generation Partnership Project (3GPP) networks, Bluetooth, mmWave, etc.), these examples are demonstrative and may therefore be readily applied to any other type or configuration of radio access network.

Figure 2:
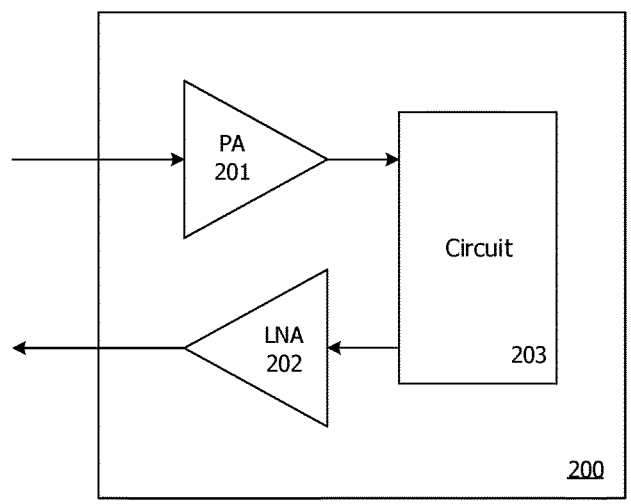
FIG. 2 shows schematically a block diagram of an example RF front end in a radio communication device including a transmitter and a receiver.

FIG. 2 shows schematically a block diagram of an example radio frequency (RF) front end 200 that may be implemented in a radio communication device including a transmitter and a receiver. A transmit signal path (Tx path) of the radio frequency (RF) front end 200 includes a PA (power amplifier) 201 for amplifying input radio frequency (RF) signals. A receive signal path (Rx path) of the radio frequency (RF) front end 200 includes an LNA (low-noise amplifier) 202 to amplify received radio frequency (RF) signals and provides the amplified received radio frequency (RF) signals as an output. One or more filters may be included to generate suitable radio frequency (RF) signals for transmission and reception. In addition, the radio frequency (RF) front end 200 may include other components or circuits 203, such as, for example, a tuner or a matching network, switches, multiplexers, and/or other circuits for coupling the radio frequency (RF) front end 200 to an antenna. In addition, other components may be included to support both transmit and receive functions.

Figure 3:
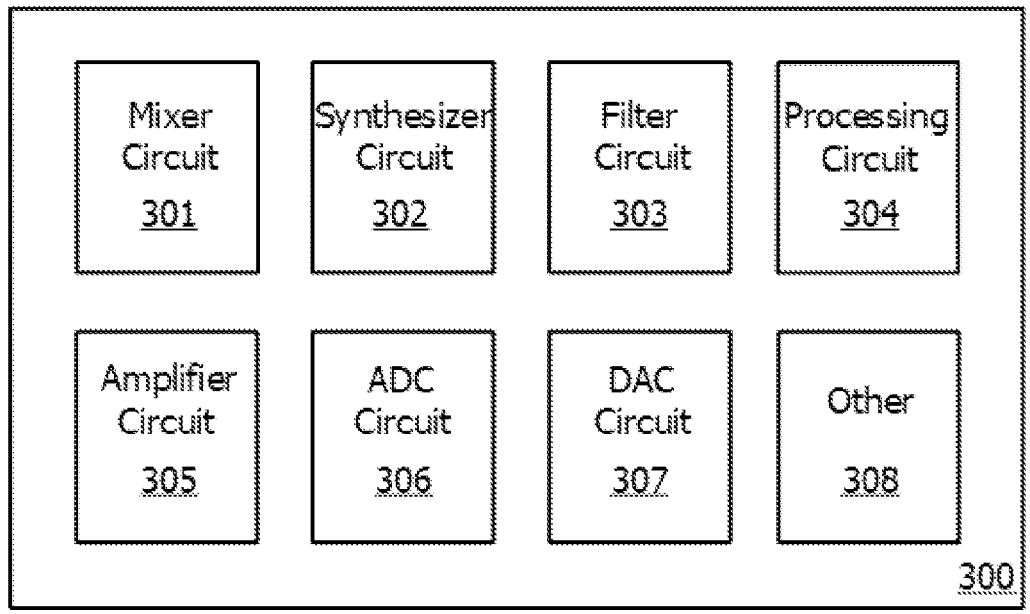
FIG. 3 shows schematically an example of a radio communication circuit.

FIG. 3 shows schematically an example of a radio communication circuit 300 which a radio communication device may include. The radio communication circuit 300 can include components such as a mixer circuit 301, a synthesizer circuit 302 (e.g., local oscillator), a filter circuit 303 (e.g., baseband filter), a processing circuit 304, an amplifier circuit 305, an analog-to-digital converter (ADC) circuit 306, a digital-to-analog (DAC) circuit 307, and other suitable digital front end (DFE) components 308, to name a few. The processing circuit 304 may include a processor, which may include a time-domain and/or frequency domain processor(s)/components in at least one example.

Accordingly, the exemplary radio frequency (RF) front end 200 referred with respect to FIG. 2 may be provided by a combination of the circuits provided with respect to the schematic representation of the example of the radio communication circuit 300. It should be noted that any of these circuits may include a plurality of circuits configured to provide the functionality. For example, the amplifier circuit 305 may include a plurality of amplifier circuits or amplifiers related to functions for various aspects of this disclosure.

The other components 308 may include logic components, modulation/demodulation elements, and an interface circuit for interfacing with another component, e.g., an SoC, or a modem. Digital front end components may include any suitable number and/or type of components configured to perform functions known to be associated with digital front ends.

The digital front end may include digital processing circuit, portions of processing circuitry, one or more portions of an on-board chip having dedicated digital front end functionality (e.g., a digital signal processor), etc. The digital front end components may selectively perform specific functions based upon the operating mode of the radio communication circuit 300. The digital front end components may facilitate beamforming.

Digital front end components may also include other components associated with data transmission such as, for instance, transmitter impairment correction such as LO correction, DC offset correction, IQ imbalance correction, and ADC skew, digital pre-distortion (DPD) calculation, correction factor (CF) calculation, and pre-emphasis (pre. emp.) calculation. To provide additional examples, the digital front end components may facilitate or perform receiver or transmitter digital gain control (DGC), up-sampling, down-sampling, zero crossing detection algorithms, phase modulation, perform beam management, digital blocker cancellation, received signal strength indicator (RSSI) measurements, DPD and calibration accelerators, test signal generation, etc.

The radio communication circuit 300 may include a receive signal path which may include the mixer circuit 301, the amplifier circuit 305, and the filter circuit 303. The transmit signal path of the radio communication circuit 300 may include the filter circuit 303, the amplifier circuit 305, and the mixer circuit 301. The radio communication circuit may also include the synthesizer circuit 302 to synthesize a frequency signal for use by the mixer circuit 301 of the receive signal path and the transmit signal path. The mixer circuit 301 of the receive signal path may be configured to down-convert radio frequency (RF) signals received based on the synthesized frequency provided by synthesizer circuit 302.

The output baseband signals and the input baseband signals may be digital baseband signals. In such aspects, the radio communication circuit 300 may include the analog-to-digital converter (ADC) circuit 306 and the digital-to-analog converter (DAC) circuit 307.

The radio communication circuit 300 may also include a transmit signal path (Tx path) which may include a circuit to up-convert baseband signals provided by a modem and provide radio frequency (RF) output signals for transmission. The receive signal path of the radio communication circuit 300 may include the mixer circuit 301, the amplifier circuit 305, and the filter circuit 303. The transmit signal path of the radio communication circuit 300 may include the filter circuit 303, the amplifier circuit 305, and the mixer circuit 301. The radio communication circuit 300 may include synthesizer circuit 302 to synthesize a frequency signal for use by the mixer circuit 301 of the receive signal path and the transmit signal path. The mixer circuit 301 of the receive signal path may be configured to received down-convert radio frequency (RF) signals based on the synthesized frequency provided by synthesizer circuit 302.

Amplifier circuit 305 may be configured to amplify the down-converted signals, and filter circuit 303 may be a low-pass filter (LPF) or band-pass filter (BPF) configured to remove unwanted signals from the down-converted signals to generate output baseband signals. Output baseband signals may be provided to another component, e.g., a modem, for further processing. The output baseband signals may be zero-frequency baseband signals, although this is not a requirement.

The mixer circuit 301 for a receive signal path may include passive mixers, although the scope of this disclosure is not limited in this respect. The mixer circuit 301 for a transmit signal path may be configured to up-convert input baseband signals based on the synthesized frequency provided by the synthesizer circuit 302 to generate radio frequency (RF) output signals. In various aspects, amplifier circuit 305 may be configured to amplify the radio frequency (RF) output signals, and filter circuit 303 may be a low-pass filter (LPF) or band-pass filter (BPF) configured to remove unwanted signals from the up-converted signals to provide communication signals to be transmitted. The radio frequency (RF) communication signals may be provided to another component, to an antenna port or an antenna.

The mixer circuit 301 of the receive signal path and the mixer circuit 301 of the transmit signal path may include two or more mixers and may be arranged for quadrature down conversion and up conversion, respectively. The mixer circuit 301 of the receive signal path and the mixer circuit 301 of the transmit signal path may include two or more mixers and may be arranged for image rejection (e.g., Hartley image rejection). The mixer circuit 301 of the receive signal path and the mixer circuit 301 may be arranged for direct down conversion and direct up conversion, respectively. The mixer circuit 301 of the receive signal path and the mixer circuit 301 of the transmit signal path may be configured for super-heterodyne operation.

In some dual-mode aspects, a separate radio IC circuit may be provided for processing signals for each spectrum, although the scope of this disclosure is not limited in this respect.

The synthesizer circuit 302 may be a fractional-N synthesizer or a fractional N/N+1 synthesizer, although the scope of the aspects is not limited in this respect as other types of frequency synthesizers may be suitable. For example, synthesizer circuit 302 may be a delta-sigma synthesizer, a frequency multiplier, or a synthesizer including a phase-locked loop with a frequency divider.

The synthesizer circuit 302 may be configured to synthesize an output frequency for use by the mixer circuit 301 of the radio communication circuit 300 based on a frequency input and a divider control input. The synthesizer circuit 302 may be a fractional N/N+1 synthesizer.

Frequency input may be provided by a voltage-controlled oscillator (VCO), although that is not a requirement. Divider control input may be provided by a processing component of the radio communication circuit 300 or may be provided by any suitable component, such as an external component like a modem. For example, the modem may provide a divider control input depending on the desired output frequency. A divider control input (e.g., N) may be determined from a look-up table based on a channel indicated by an external component.

Synthesizer circuit 302 of the radio communication circuit 300 may include a divider, a delay-locked loop (DLL), a multiplexer, and a phase accumulator. The divider may be a dual modulus divider (DMD) and the phase accumulator may be a digital phase accumulator (DPA). The DMD may be configured to divide the input signal by either N or N+1 (e.g., based on a carry out) to provide a fractional division ratio. The DLL may include a set of cascaded, tunable, delay elements, a phase detector, a charge pump, and a D-type flip-flop. The delay elements may be configured to break a VCO period up into No equal packets of phase, where Nd is the number of delay elements in the delay line. In this way, the DLL provides negative feedback to help ensure that the total delay through the delay line is one VCO cycle.

Synthesizer circuit 302 may be configured to generate a carrier frequency as the output frequency, while in an alternative, the output frequency may be a multiple of the carrier frequency (e.g., twice the carrier frequency, four times the carrier frequency) and used in conjunction with quadrature generator and divider circuit to generate multiple signals at the carrier frequency with multiple different phases with respect to each other. The output frequency may be a LO frequency (fLO). The radio communication circuit 300 may include an IQ/polar converter.

While the radio communication circuit 300 described herein includes traditional super-heterodyning schemes or architectures, other types of transceiver or transmitter architectures and schemes may be used. The radio communication circuit 300 may include components to implement a near zero IF scheme, a Direct Conversion scheme, or a digital transmission scheme, such as, for example, a Digital IQ transmission, a Digital Polar transmission, and the like.

The radio communication circuit 300 may include a transmit path that includes or implements a direct digital transmitter (DDT). That is, a DDT may include a digital signal processor, an RF digital-to-analog converter (RF-DAC), an RF filter/antenna coupler. Further, a DDT may be implemented with or without an IQ-mixer. In general, an RF-DAC may be included on an RFIC to convert digital input into an RF signal. A DDT may include other digital components such as numerically controlled oscillator (NCO) and digital mixers for shifting an input signal to the desired frequency.

The use of a DDT can reduce the number of analog components needed in the transmitter or transmit path. For example, analog LOs, analog filters, analog mixers, and etc., may be eliminated from the RFIC when a direct digital transmitter such as DDT is employed. Further, the use of a digital transmitter or digital transmission schemes may bring energy savings and efficiencies.

Figure 4:
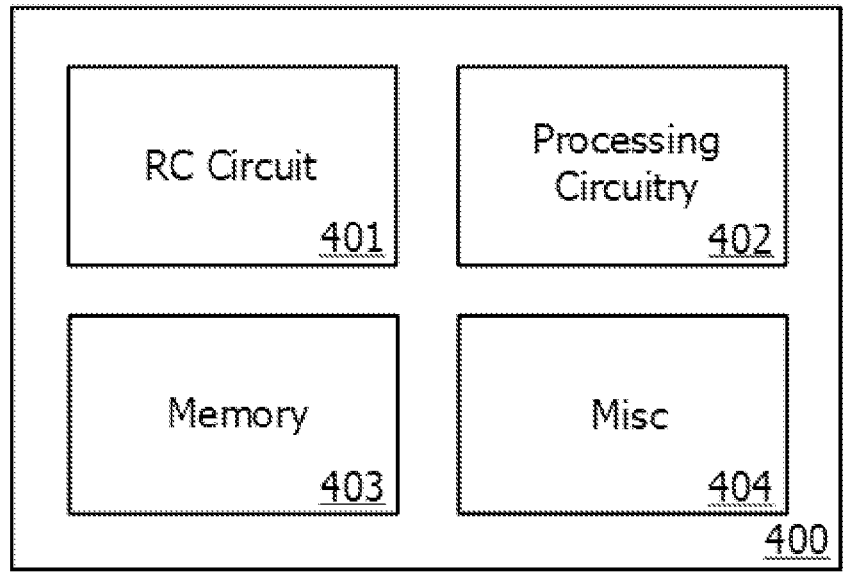
FIG. 4 shows schematically a block diagram of an exemplary radio communication device or system.

FIG. 4 illustrates schematically a block diagram of an exemplary radio communication device 400 or system. The components of the radio communication device 400 are provided for ease of explanation, and in other cases, the radio communication device 400 can include additional, less, or alternative components as those shown in FIG. 4.

As shown in FIG. 4, the radio communication device 400 can include a radio communication circuit 401, exemplarily the radio communication circuit provided with respect to FIG. 3, a processing circuit 402, a memory 403. The radio communication device 400 may include miscellaneous components, modules, or portions 404 as well. The radio communication device 400 may include a modem or SoC. The radio communication device 400 may include one or more power sources, display interfaces, peripheral devices, ports (e.g., input, output), etc.

The radio communication device 400 may be used for products involving 5G, Wifi, BT, UWB, or any suitable wireless network products. The radio communication device 400 may also be used for any device supporting data-intensive applications, including streaming video (e.g., 4K, 8K video) or augmented/virtual reality (AR/VR) devices. The radio communication device 400 may also be used for vehicles, e.g., to help support a self-driving car and/or to be used as vehicle network. The radio communication device 400 may be used for Vehicle-to-everything (V2X) which includes vehicle-to-vehicle (V2V) and vehicle-to-infrastructure (V2I).

The processing circuit 402 may include any suitable number and/or type of computer processors, such as, for facilitating control of the radio communication device 400. In some cases, the processing circuit 402 may include a baseband processor (or suitable portions thereof) implemented by the radio communication device. In other cases, the processing circuit 402 may be one or more processors that are separate from the baseband processor (e.g., one or more digital signal processors). The processing circuit 402 may be working together with a processing circuit of the radio communication circuit 401. The processing circuit 402 may include a processing circuit of the radio communication circuit 401. Additionally, or alternatively, other examples may include various functions discussed herein by the processing circuit 402.

The processing circuit 402 may be configured to carry out instructions to perform arithmetical, logical, and/or input/output (I/O) operations, and/or to control the operation of one or more components of the radio communication device 400. For example, the processing circuit 402 can include one or more microprocessors, memory registers, buffers, clocks, etc. Moreover, aspects include processing circuit 402 communicating with and/or controlling functions associated with the memory 403 and/or functions of the radio.

The memory 403 may store data and/or instructions such that, when the instructions are executed by the processing circuit 402, the processing circuit 402 performs the various functions described herein. The memory 403 may be implemented as a non-transitory computer-readable medium storing one or more executable instructions such as, for example, logic, algorithms, code, etc. Instructions, logic, code, etc., stored in the memory 403 may enable the aspects disclosed herein to be functionally realized.

Figure 5:
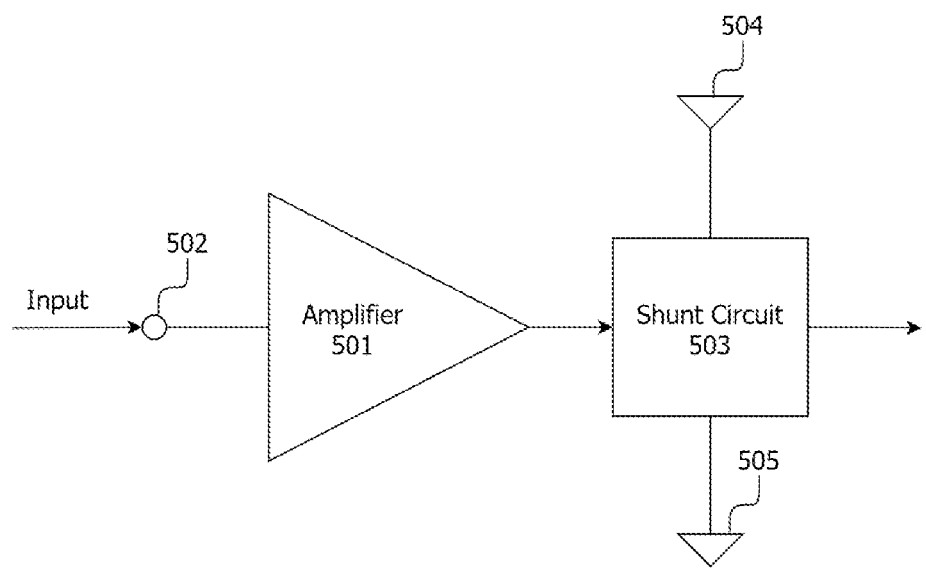
FIG. 5 shows schematically an example of an amplifier circuit including a shunt circuit.

FIG. 5 shows schematically an example of an amplifier circuit. The amplifier circuit includes an amplifier 501. The amplifier 501 may be coupled to an input terminal 502 to receive an input signal which the amplifier 501 will amplify. The amplifier 501 may receive the input signal from the input terminal 502 and the amplifier 501 may amplify the input signal. The amplifier 501 provides an output signal from its output.

The amplifier 501 may include an amplifier stage. The amplifier 501 may include one or more transistors configured to amplify the input signal. The amplifier 501 may be a transconductance amplifier in a differential configuration configured to receive the input signal as input voltage in differential pairs and produces an output current for the output signal. The input signal may include a radio frequency (RF) signal.

Accordingly, the output signal of the amplifier 501 may include an alternative current (AC) component based on the input signal and a direct current (DC) component. The amplifier 501 may be coupled to a voltage source to receive an electrical supply. It may be desirable to lower the direct current (DC) component of the output signal of the amplifier 501.

The amplifier circuit may further include a shunt circuit 503. The shunt circuit 503 is configured to divide a direct current (DC) which the shunt circuit 503 couples to. The shunt circuit 503 may be configured to divide the direct current (DC) into a first direct current (DC) portion and a second direct current (DC) portion electrically. The shunt circuit 503 may further be configured to provide the second direct current (DC) portion to another component. The shunt circuit 503 may shunt the second direct current (DC) portion to a ground terminal 505.

The shunt circuit 503 may include a supply terminal 504 to receive an electrical supply. Further, the shunt circuit 503 may determine a ratio between the first direct current (DC) portion and the second direct current (DC) portion based on the electrical supply. The shunt circuit 503 may determine the amount of the first direct current (DC) portion, and the amount of the second direct current (DC) portion based on the amount of the electrical supply. The shunt circuit 503 may determine the amount of a direct current (DC) portion to shunt (i.e. the second direct current (DC) portion) based on a supply voltage applied to the supply terminal 504.

Accordingly, the shunt circuit 503 may divide the output signal of the amplifier 501 based on the electrical supply provided to the supply terminal 504. The shunt circuit 503 may include an active load that is coupled to the output of the amplifier 501, and the active load may be configured to divide the direct current (DC) portion of the output signal of the amplifier 501 based on the electrical supply. The shunt circuit 503 may include at least one transistor that is coupled to the amplifier 501. The at least one transistor may be configured to divide direct current (DC) portion of the output signal of the amplifier 501 based on the electrical supply. The shunt circuit 503 may further be coupled to a current source. The current source may be configured to receive the electrical supply, such as a supply voltage, and the current source may be configured to provide a supply current to the amplifier 501 based on the electrical supply.

Figure 6:
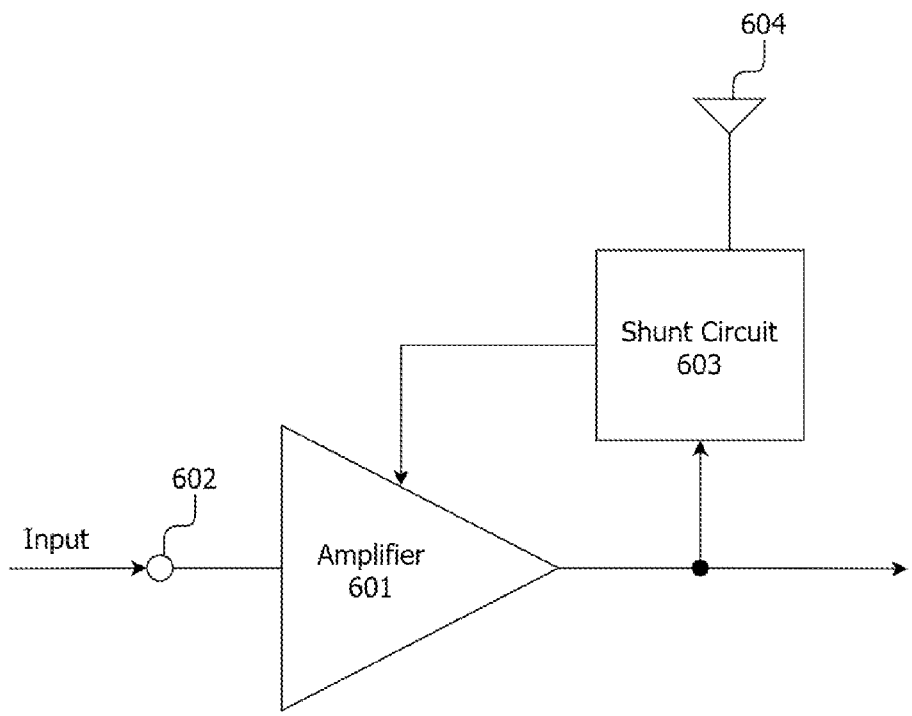
FIG. 6 shows schematically an example of an amplifier circuit including a shunt circuit.

FIG. 6 shows schematically an example of an amplifier circuit. The amplifier circuit includes an amplifier 601. The amplifier 601 may be coupled to an input terminal 602 to receive an input signal. The amplifier 601 may receive the input signal from the input terminal 602 and the amplifier 601 may amplify the input signal. The amplifier 601 provides an output signal from its output. The amplifier 601 may include an amplifier stage. The amplifier 601 may include one or more transistors configured to amplify the input signal. The amplifier 601 may include a transconductance amplifier in a differential configuration configured to receive the input signal as input voltage in differential pairs and to produce an output current. The input signal may include a radio frequency (RF) signal.

The output signal of the amplifier 601 may include an alternative current (AC) component based on the input signal and a direct current (DC) component. The amplifier 601 may be coupled to a voltage source to receive a first electrical supply. It may be desirable to lower the direct current (DC) component of the output signal of the amplifier 601.

The amplifier circuit may further include a shunt circuit 603. The shunt circuit 603 may be configured to divide a direct current (DC) component from a signal path in which the shunt circuit 603 is coupled to a first direct current (DC) portion and a second direct current (DC) portion electrically. The shunt circuit 603 may further be configured to provide the second direct current (DC) portion to another component. In other words, the shunt circuit 603 may be configured to shunt the second direct current (DC) portion to another component from the direct current (DC) component at the signal path.

The shunt circuit 603 may include a supply terminal 604 to receive an electrical supply. Further, the shunt circuit 603 may determine the second direct current (DC) portion based on the electrical supply. In other words, the shunt circuit 603 may determine the amount of the current to shunt based on the electrical supply. The shunt circuit 603 may determine the amount of the second direct current (DC) portion based on the amount of the electrical supply. The shunt circuit 603 may determine the amount of the direct current (DC) portion to shunt (i.e. the second direct current (DC) portion) based on a supply voltage applied to the supply terminal 604.

Accordingly, the shunt circuit 603 may divide the direct current (DC) component of the output signal of the amplifier 601 based on the electrical supply provided to the supply terminal 604. The shunt circuit 603 may be coupled to a current source. The shunt circuit 603 may include an active load that is coupled to the output of the amplifier 601, and the active load may be configured to divide the direct current (DC) component of the output signal of the amplifier 601 based on the electrical supply. The shunt circuit 603 may include at least one transistor that is coupled to the amplifier 601. The at least one transistor may be configured to divide direct current (DC) component of the output signal of the amplifier 601 based on the electrical supply. The current source may be configured to receive the electrical supply, such as a supply voltage, and the current source may be configured provide a supply current to the amplifier 601 based on the electrical supply.

Accordingly, the shunt circuit 603 may provide the second direct current (DC) portion of the output signal of the amplifier 601 to the amplifier 601. The amplifier 601 may be configured to receive a second electrical supply to amplify the input signal using the first electrical supply and the second electrical supply as the electrical supply. The shunt circuit 603 may provide the second electrical supply to the amplifier 601. The second electrical supply may include the second direct current (DC) portion of the output signal of the amplifier 601. Furthermore, the second electrical supply may include a current source electrical supply which the current source may provide.

Figure 7:
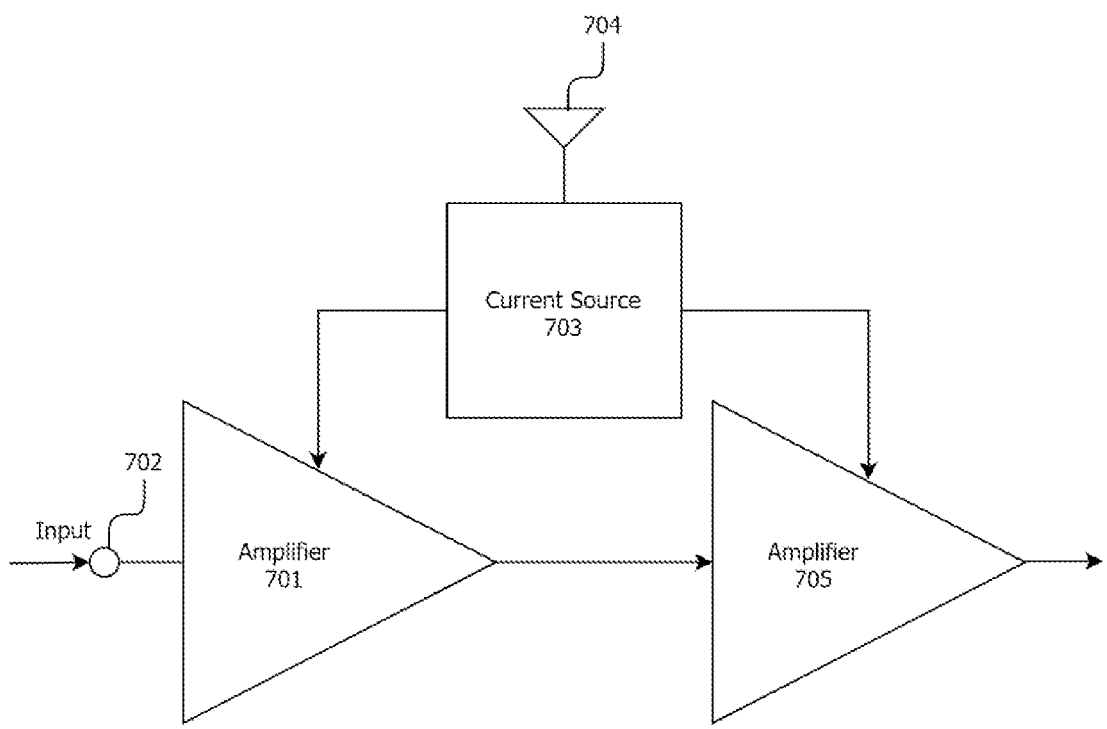
FIG. 7 shows schematically an example of an amplifier circuit including two amplifiers and a current source.

FIG. 7 shows schematically an example of an amplifier circuit. The amplifier circuit includes an amplifier 701. The amplifier 701 may be coupled to an input terminal 702 to receive an input signal. The amplifier 701 may receive the input signal from the input terminal 702 and the amplifier 701 may amplify the input signal. The amplifier 701 provides an output signal from its output. The amplifier 701 may include an amplifier stage. The amplifier 701 may include one or more transistors configured to amplify the input signal. The amplifier 701 may include a transconductance amplifier in a differential configuration configured to receive the input signal as input voltage in differential pairs and to produce an output current. The input signal may include a radio frequency (RF) signal. The output signal of the amplifier 701 may include an alternative current (AC) component based on the input signal and a direct current (DC) component.

The amplifier circuit may further include a current source 703. The current source 703 may be coupled to an electrical supply terminal 704 to receive an electrical supply. The current source 703 may be coupled to a voltage supply to receive a supply voltage from the electrical supply terminal 704 and the current source 703 may be configured to provide an output current based on the received electrical supply.

The electrical supply may include an input current which the current source 703 may receive from the electrical supply terminal 704. The current source 703 may include a shunt circuit. The shunt circuit may include one of the shunt circuits that are provided in FIG. 5 and FIG. 6. The shunt circuit may be coupled to the output of the amplifier 701, and the shunt circuit may be configured to shunt a portion of the DC component of the output signal of the amplifier 701.

The voltage supply may be configured to provide direct current (DC) voltage at various levels. The voltage supply may be configured to provide at least a first voltage and a second voltage to the electrical supply terminal 704. The shunt circuit of the current source 703 may be configured to shunt a first portion of the direct current (DC) component of the output signal of the amplifier 701 based on the first voltage provided by the voltage supply, and the shunt circuit may be configured to shunt a second portion of the direct current (DC) component of the output signal of the amplifier 701 based on the second voltage. In other words, the amount of the direct current (DC) component of the output signal which the shunt circuit shunts may vary based on the supply voltage provided to the electrical supply terminal 704.

Furthermore, the amplifier circuit may include a second amplifier 705 coupled to the amplifier. The second amplifier 705 may be coupled to the amplifier 701 to receive the output of the amplifier 701 as a second amplifier input signal. The current source 703 may be coupled to the second amplifier 705 to provide an electrical supply to the second amplifier. The current source 703 may be configured to provide the output current to the amplifier 701 and the second amplifier 705.

Figure 8:
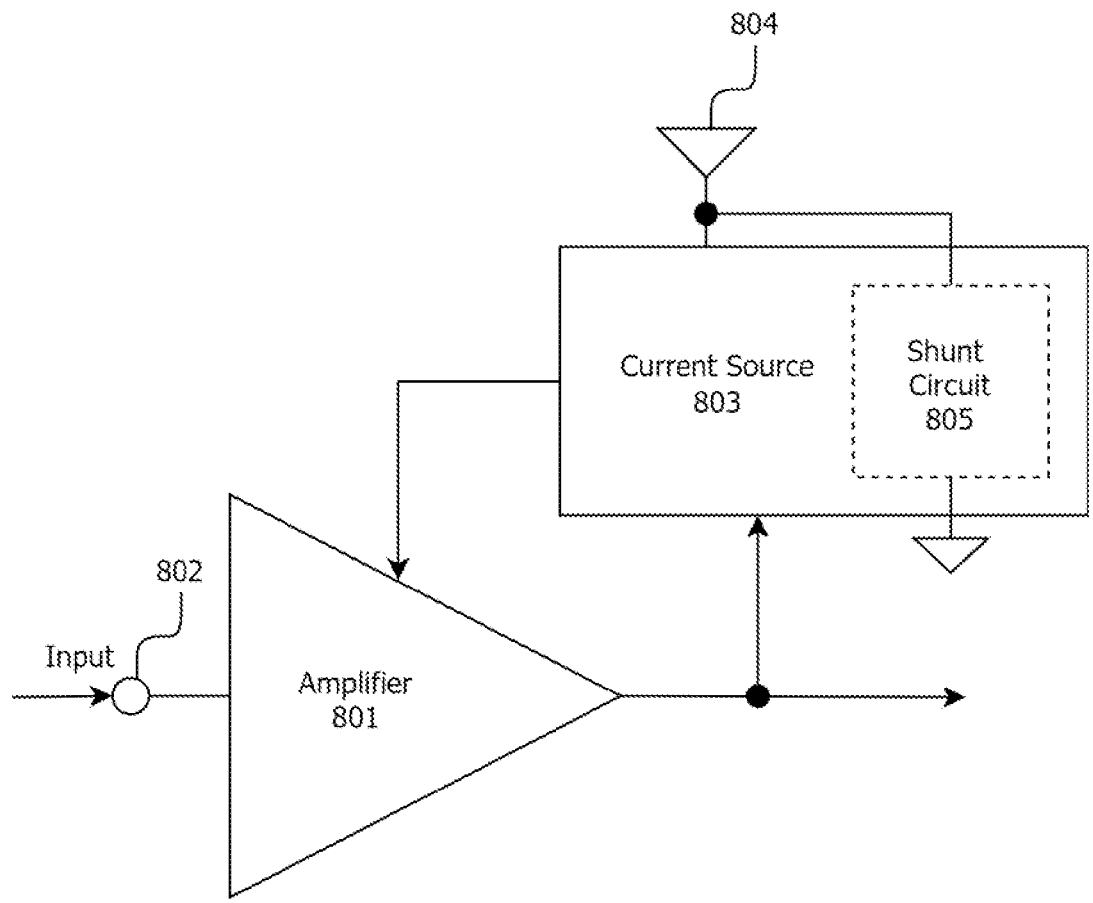
FIG. 8 shows schematically an example of an amplifier circuit including a current source.

FIG. 8 shows schematically an example of an amplifier circuit. The amplifier circuit includes an amplifier 801. The amplifier 801 may be coupled to an input terminal 802 to receive an input signal. The amplifier 801 may receive the input signal from the input terminal 802 and the amplifier 801 may amplify the input signal. The amplifier 801 provides an output signal from its output. The amplifier 801 may be coupled to a current source 803 to receive an electrical current to supply the amplifier 801. The current source 803 may be coupled to an electrical supply terminal 804. The output signal of the amplifier 801 may include an alternative current (AC) component based on the input signal and a direct current (DC) component.

The current source 803 may include a shunt circuit 805. The shunt circuit 805 may be coupled to the electrical supply terminal 804 and the shunt circuit 805 may be configured to shunt a portion of an input current at the electrical supply terminal 804. Accordingly, the input current at the electrical supply terminal 804 may be divided into a first input current and a second input current. The current source 803 may receive the first input current as the electrical supply, and the shunt circuit 805 may provide the second input current to a ground terminal. Alternatively, the shunt circuit 805 may provide the second input current to another component. Accordingly, a reduced electrical supply may be provided to the current source 803.

The shunt circuit 805 may be configured to shunt the portion of the input current based on the supply voltage at the electrical supply terminal 804. Further, the shunt circuit 805 may be configured to shunt the portion of the input current at the electrical supply terminal 804 based on a predefined threshold. The shunt circuit 805 may be configured to shunt the portion of the input current at the electrical supply terminal 804 when the input current is above the predefined threshold.

The current source 803 may be configured to receive a first electrical supply current when the voltage at the electrical supply terminal 804 is below the predefined threshold, and the current source 803 may be configured to receive a second electrical supply current when the voltage at the electrical supply terminal 804 is above the predefined threshold. The first output current may be higher than the second output current. The first electrical supply current may include the current at the electrical supply terminal (i.e. the shunt circuit 805 may not shunt any portion of the input current). Alternatively, the shunt circuit 805 may be configured to shunt a portion of the input current when the direct current (DC) component of the output signal is above a predefined threshold.

The current source 803 may be configured to provide an output current to the amplifier 801 to partially supply the amplifier 801. For example, the current source 803 may be configured to provide 20% of a supply current which the amplifier 801 may receive to amplify the input signal. Furthermore, the amplifier circuit may further include a second amplifier. The second amplifier may be an amplifier stack. The current source 803 may be configured to provide a first output current to the amplifier 801 and a second output current to the second amplifier.

Figure 9:
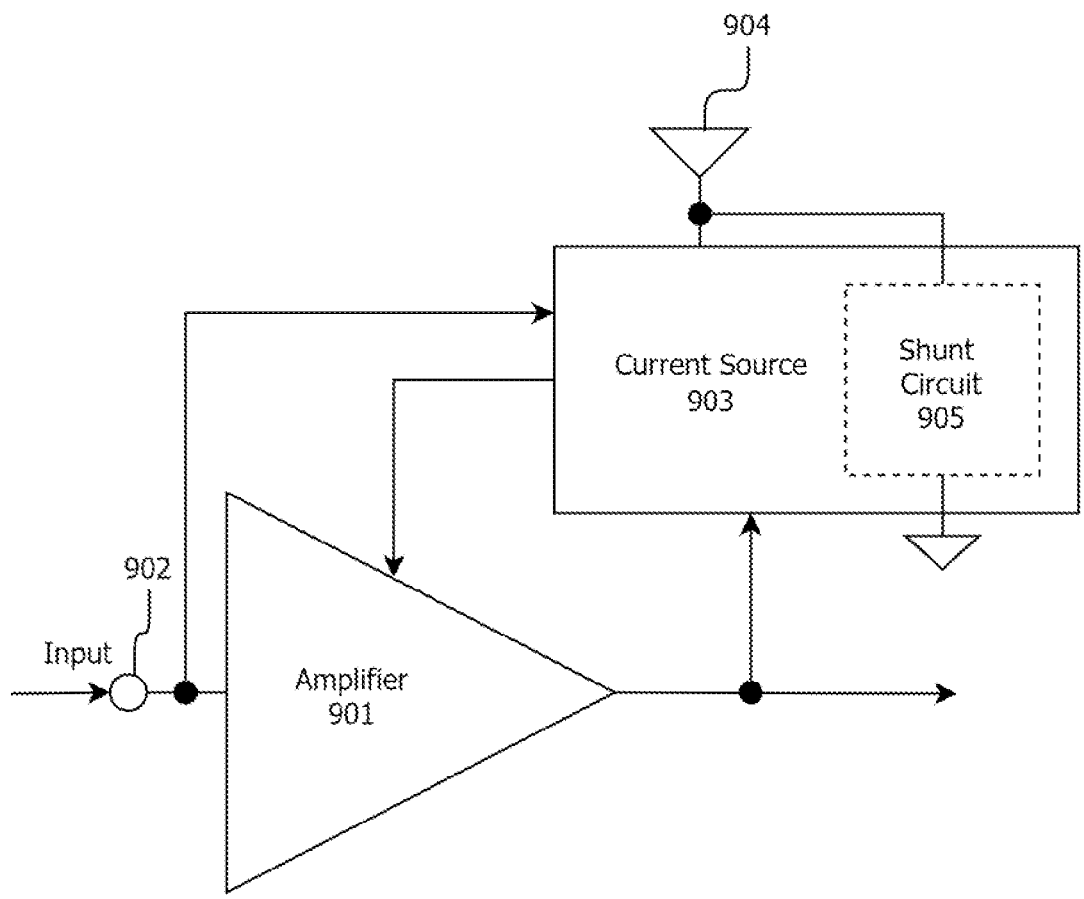
FIG. 9 shows schematically an example of an amplifier circuit.

FIG. 9 shows schematically an example of an amplifier circuit. The amplifier circuit includes an amplifier 901. The amplifier 901 may be coupled to an input terminal 902 to receive an input signal. The amplifier 901 may receive the input signal from the input terminal 902 and the amplifier 901 may amplify the input signal. The amplifier 901 provides an output signal from its output. The amplifier 901 may be coupled to a current source 903 to receive an electrical current to supply the amplifier 901.

The current source 903 may be further configured to receive an input signal from the input terminal 902. The current source 903 may be configured to receive the input signal which the amplifier 901 also receives. The current source 903 may be configured to receive direct current (DC) component of the input signal which the amplifier 901 receives. The current source 903 may be coupled to an electrical supply terminal 904. The output signal of the amplifier 901 may include an alternative current (AC) component based on the input signal and a direct current (DC) component.

The current source 903 may include a shunt circuit 905. The shunt circuit 905 may be coupled to the electrical supply terminal 904 and the shunt circuit 905 may be configured to shunt a portion of an input current at the electrical supply terminal 904. Accordingly, the input current at the electrical supply terminal 904 may be divided into a first input current and a second input current. The current source 903 may receive the first input current as the electrical supply, and the shunt circuit 905 may provide the second input current to a ground terminal. Alternatively, the shunt circuit 905 may provide the second input current to another component. Accordingly, a reduced electrical supply may be provided to the current source 903.

The shunt circuit 905 may be configured to shunt the portion of the input current based on the supply voltage at the electrical supply terminal 904. Further, the shunt circuit 905 may be configured to shunt the portion of the input current at the electrical supply terminal 904 based on a predefined threshold. The shunt circuit 905 may be configured to shunt the portion of the input current at the electrical supply terminal 904 when the input current is above the predefined threshold.

The current source 903 may be configured to receive a first electrical supply current from the electrical supply terminal when the voltage at the electrical supply terminal 904 is below the predefined threshold, and the current source 903 may be configured to receive a second electrical supply current from the electrical supply 904 when the voltage at the electrical supply terminal 904 is above the predefined threshold. The first electrical supply current may be higher than the second electrical supply current. The first electrical supply current may include the current at the electrical supply (i.e. the shunt circuit 905 does not shunt). Alternatively, the shunt circuit 905 may be configured to shunt the portion of the current at the electrical supply terminal 904 when the direct current (DC) component of the output signal is above a predefined threshold.

Furthermore, the current source 903 may be configured to divide the direct current (DC) signal of the output signal based on the input signal. The voltage supply may provide a supply voltage to the electrical supply terminal 904 based on the input signal. The voltage supply may provide a first supply voltage and a second supply voltage based on the input signal. The voltage supply may provide the first supply voltage when the amplitude of the input signal is below a predefined threshold, and the voltage supply may provide the second supply voltage when the amplitude of the input signal is above the predefined threshold. The first supply voltage may be higher than the second supply voltage.

Furthermore, the shunt circuit 905 may be configured to shunt the portion of the input current at the electrical supply terminal 904 based on the input signal, or direct current (DC) component of the input signal. The shunt circuit 905 may be configured to shunt a first portion of the input current when the amplitude of the input signal is below a predefined threshold, and the shunt circuit 905 may be configured to shunt a second portion of the input current when the amplitude of the input signal is above the predefined threshold. Accordingly, the amount of the portion of the second input current (i.e. the portion of the input current to be shunted) may increase as the amplitude of the input signal increases. Alternatively, the amount of the portion of the second input current may decrease as the amplitude of the input signal decreases.

The current source 903 may be configured to provide an output current to the amplifier 901 to partially supply the amplifier 901. For example, the current source 903 may be configured to provide 20% of a supply current which the amplifier 901 may receive to amplify the input signal. Furthermore, the amplifier circuit may further include a second amplifier. The second amplifier may be an amplifier stack. The current source 903 may be configured to provide a first output current to the amplifier 901 and a second output current to the second amplifier.

Figure 10:
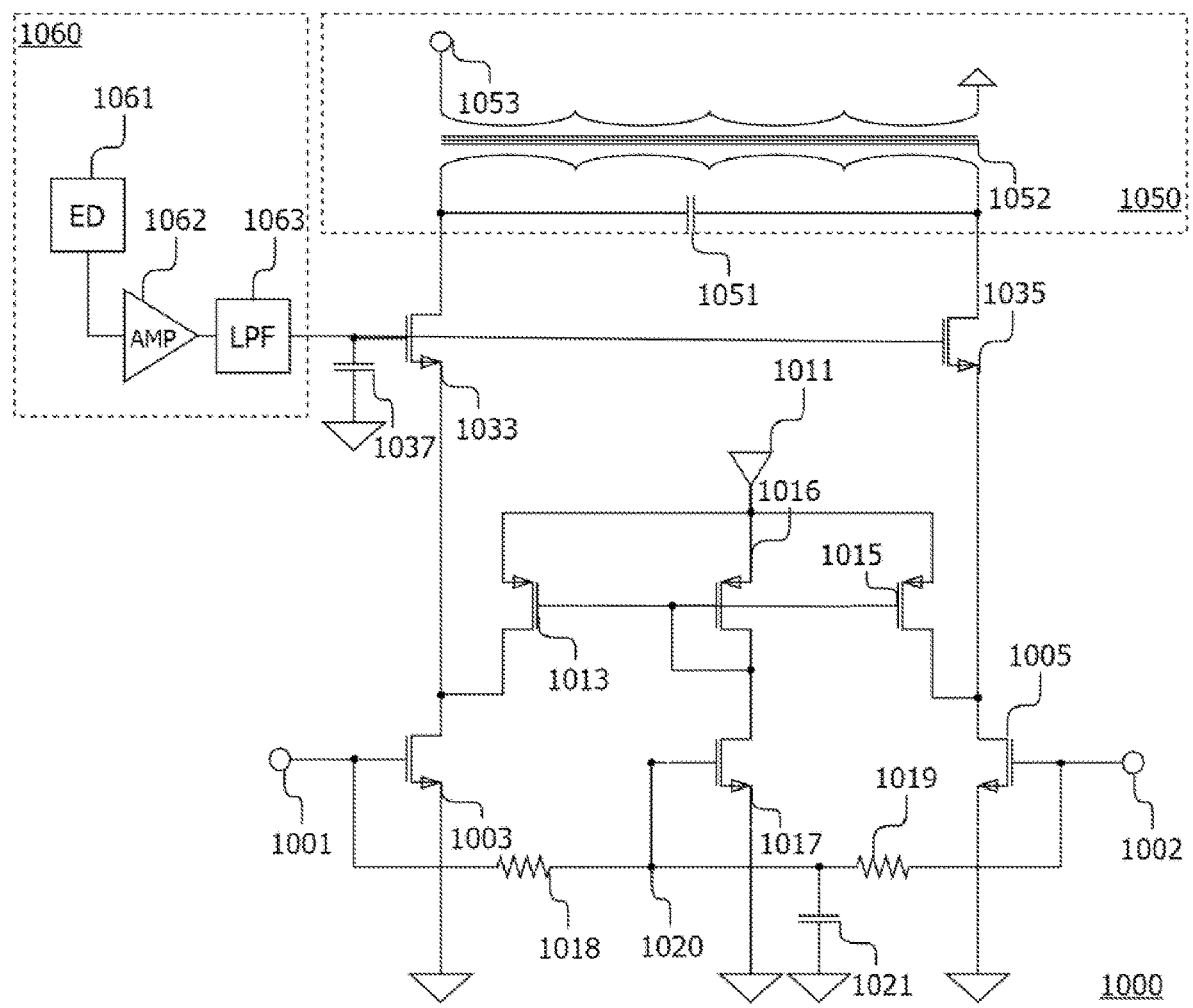
FIG. 10 shows schematically an example of an amplifier circuit coupled to a processor.

FIG. 10 shows schematically an example of an amplifier circuit in accordance with various aspects of this disclosure. The amplifier circuit includes an amplifier, an amplifier stack, a matching block 1050, and a processor 1060. The amplifier circuit may alternatively be coupled to a processor of a radio communication circuit. When the amplifier circuit is coupled to the processor of the radio communication circuit, the processor of the radio communication circuit may perform similar aspects with the processor 1060. In other words, the processor of the radio communication circuit may include the processor 1060.

The amplifier may include a transconductance amplifier in a differential configuration. The amplifier may include two input terminals, a first input terminal 1001 and a second input terminal 1002 which may be configured to receive a radio frequency (RF) input signal in differential pairs. The first input terminal 1001 may be coupled to a gate terminal of a first transistor 1003. The second input terminal may be coupled to a gate terminal of a second transistor 1005. The first transistor 1003 and the second transistor 1005 may include an N-type metal-oxide semiconductor (NMOS).

The amplifier circuit may include a current source to provide output current based on an electrical supply at the electrical supply terminal 1011. The current source may be coupled to the electrical supply terminal 1011 to receive an electrical supply. The electrical supply may include an input current provided by a voltage supply that is coupled to the electrical supply terminal 1011. The current source may include a first current source transistor 1013, and a second current source transistor 1015. A drain terminal of the first current source transistor 1013 may be coupled to a source terminal of the first transistor 1003 of the amplifier, and a drain terminal of the second current source transistor 1015 may be coupled to a source terminal of the second transistor 1005 of the amplifier. The first current source transistor 1013 the second current source transistor 1015 may include P-type metal-oxide-semiconductor (PMOS).

The amplifier circuit may further include a first supply transistor 1017, and a second supply transistor 1016. A gate terminal of the first supply transistor 1017 may be coupled to an input node 1020. The input node 1020 may be configured to provide a direct current (DC) voltage between the first input terminal 1001 and the second input terminal 1002. The input node 1020 may be coupled to a first resistor 1018 which is coupled to the first input terminal 1001, and the input node 1020 may be coupled to a second resistor 1019 which is coupled to the second input terminal 1002. The resistance values of the first resistor 1018 and the second resistor 1019 may be substantially equal. The input node 1020 may also be coupled to a capacitor 1021 which is coupled to a ground terminal. Accordingly, the current source, namely the first current source transistor 1013 and the second current source transistor 1015 may receive the electrical supply based on the input signal. The current source may receive the electrical supply from the electrical supply terminal 1011 based on the direct current (DC) voltage between the gate terminal of the first transistor 1003 and the gate terminal of the second transistor 1005.

A source terminal of the second supply transistor 1016 may be coupled to the electrical supply terminal 1011, and a drain terminal of the second supply transistor 1016 may be coupled to the first supply transistor 1017. The drain terminal of the second supply transistor 1016 may be coupled to a gate terminal of the second supply transistor 1016. The gate terminal of the second supply transistor 1016 may further be coupled to gate terminals of the first current source transistor 1013 and the second current source transistor 1015.

Accordingly, the first supply transistor 1017 and the second supply transistor may be used to arrange the electrical supply of the current source, namely the first current source transistor 1013 and the second current source transistor 1015 in combination with the first and second resistors 1018, 1019, and the capacitor 1021. The first supply transistor 1017 may include an N-type metal-oxide-semiconductor (NMOS). The second supply transistor 1016 may include a P-type metal-oxide-semiconductor (PMOS). Accordingly, a shunt circuit which may include the combination of the first supply transistor 1017, the second supply transistor 1016, the first and second resistors 1018, 1019, and the capacitor 1021 may be configured to reduce the direct current (DC) at the drain terminals of the first transistor 1003 and the second transistor 1005. The shunt circuit may be configured to shunt a portion of the input current supplied at the electrical supply terminal 1011.

The amplifier circuit may be configured such that a direct current (DC) current that is configured to flow through the first transistor 1003 may be greater than a direct current (DC) current that is configured to flow through the first supply transistor 1017. The term current flowing through may refer to a direct current (DC) current flowing from a drain to a source of an N-type metal-oxide-semiconductor (NMOS). Accordingly, the first supply transistor 1017 may have a width of W which may be smaller than the width of the first transistor 1003.

Similarly, the amplifier circuit may further be configured such that a direct current (DC) current that is configured to flow through the second transistor 1005 may be greater than a DC current that is configured to flow through the first supply transistor 1017. Accordingly, the first supply transistor 1017 may have the width of W which may be smaller than the width of the second transistor 1005, as it is desirable to use matching transistors for the first transistor 1003 and the second transistor 1005.

The amplifier circuit may be configured such that DC currents that are configured to flow through the first transistor 1003 and the second transistor 1005 at respective operations for a differential amplifier, may be K times of a DC current that is configured to flow through the first supply transistor 1017. The first supply transistor 1017 may have the width of W, and each of the first transistor 1003 and the second transistor 1005 may have a width of K*W, while the length L of the first transistor 1003, the second transistor 1005, and the first supply transistor 1017 may be substantially equal.

Furthermore, the amplifier circuit may be configured such that DC currents that are configured to flow through the first current source transistor 1013 and the second current source transistor 1015 at respective operations for a differential amplifier, may be P times of a DC current that is configured to flow through the second supply transistor 1038. Accordingly, the DC current provided by the first current source transistor 1013 and/or the second current source transistor 1015 at respective operations may be P/K of the DC current of the first transistor 1003 and/or the second transistor 1005 respectively.

The amplifier circuit may further include a second amplifier. The second amplifier may be a stack amplifier. The amplifier stack may include a first transistor 1033 and a second transistor 1035 arranged in a differential configuration. The first transistor 1033 of the amplifier stack and the second transistor 1035 of the amplifier stack may be coupled to the amplifier to receive the output signal of the amplifier. The first transistor 1033 of the amplifier stack may be coupled to the first transistor 1003 of the amplifier.

Accordingly, a source terminal of the first transistor 1033 of the amplifier stack may be coupled to the drain terminal of the first transistor 1003 of the amplifier and the source terminal of the first current source transistor 1013. A source terminal of the second transistor 1035 of the amplifier stack may be coupled to the drain terminal of the second transistor 1005 of the amplifier and the source terminal of the second current source transistor 1015. The first transistor 1033 of the amplifier stack and the second transistor 1035 of the amplifier stack may include N-type metal-oxide-semiconductor(s) (NMOS).

Accordingly, the P-type metal-oxide-semiconductors used for the current source may be configured to neutralize a parasitic capacitance provided by the first transistor 1033 of the amplifier stack and the second transistor 1035 of the amplifier stack. It may be desirable to decrease the parasitic capacitance provided by the first transistor 1033 of the amplifier stack and the second transistor 1035 of the amplifier stack to improve linearity of the amplifier circuit.

The amplifier circuit may include one amplifier stack, the amplifier stack. The output of the amplifier stack may be coupled to a matching block 1050 to match the impedance. Accordingly, a drain terminal of the first transistor 1033 of the amplifier stack, and a drain terminal of the second transistor 1035 of the amplifier stack may provide an output of the amplifier stack. The drain terminal of the first transistor 1033 of the amplifier stack, and the drain terminal of the second transistor 1035 of the amplifier stack may be coupled to a decoupling capacitor 1051, and a transformer 1052. Accordingly, the amplifier circuit provides an amplifier circuit output signal from an amplifier circuit output 1053.

Furthermore, the amplifier stack may include a decoupling capacitor 1017 coupled to an input to receive an input control signal to control the first transistor 1033 and the second transistor 1035. Alternatively, the radio communication circuit may provide a decoupling capacitor which may be equivalent to the decoupling capacitor 1017 to filter out the direct current (DC) component of the input control signal.

The amplifier circuit may further include a processor 1060. Alternatively, the amplifier circuit may be coupled to a processor of a radio communication circuit. When the amplifier circuit is coupled to the processor of the radio communication circuit, the processor of the radio communication circuit may perform similar aspects with the processor 1060. The processor 1060 may provide the input control signal to the amplifier stack.

The processor 1060 may receive the input signal which may include the radio frequency (RF) input signal, and the processor 1060 may the input control signal which is based on the envelope of the input signal to the amplifier stack. In another example, the processor 1060 may receive an input signal which may include the amplifier circuit output signal (which may also be the output signal of the amplifier stack) received from the amplifier circuit output 1053 and the processor 1060 may provide the input control signal which is based on the envelope of the amplifier circuit output signal to the amplifier stack, which the amplifier circuit output signal may include an amplified version of the radio frequency (RF) input signal. The processor 1060 may receive at least two of the radio frequency (RF) input signal and/or the output signal of the amplifier stack and/or the amplifier circuit output signal to provide the input control signal.

The processor 1060 may be configured to detect an envelope signal of a received signal. The processor 1060 may include an envelope detector 1061 configured to detect an envelope signal of a received signal. The processor 1060 may further adjust the amplitude and/or phase of the envelope signal. The processor 1060 may adjust the amplitude and/or phase of the envelope signal in order to align the envelope signal to an envelope of the signal flowing through the source and drain terminals of the first transistor 1033 and/or the second transistor 1035 of the amplifier stack. The processor 1060 may adjust the amplitude and/or phase of the envelope signal so that the gate-source and gate-drain cross voltages of the first transistor 1033 and/or the second transistor 1035 of the amplifier stack in terms of envelopes of these signals become flatter. The processor 1060 may adjust the amplitude and/or phase of the envelope signal to increase the correlation between the envelope of the signal between the gate-source terminals and the gate-drain terminals of the first transistor 1033 and/or the second transistor 1035 of the amplifier stack.

The processor 1060 may adjust the amplitude and/or phase of the envelope signal to provide the first input control signal and the second input control signal (and further input control signals for other amplifier stacks) for the transistors of each stack of the plurality of stacks, in order to increase the correlation between the envelope of the signal between the gate-source terminals and the gate-drain terminals of the respective transistors, and/or in order to keep the gain of the respective stack amplifier linear or constant, and/or in order to keep the ratio of the capacitance of the gate-source terminals and the capacitance of the drain-source terminals of the respective transistor linear or constant, and/or in order to reduce the memory effects for the respective amplifier stack.

The processor 1060 can be implemented by using either a digital method or an analog method to detect the envelope signal from the input modulated RF signal and process the envelope signals with amplitude and phase adjustments. The processor 1060 can also be implemented by either a digital method or an analog method with the envelope signal as input.

The processor 1060 may adjust the amplitude and/or phase of the envelope signal in order to keep the cross voltage between the gate terminal and source terminal of at least one of the transistors of the plurality of amplifier stacks substantially constant. The processor 1060 may adjust the amplitude and/or phase of the envelope signal in order to reduce the cross voltage between the gate terminal and drain terminal of at least one of the transistors of the plurality of amplifier stacks substantially constant.

The processor 1060 may adjust the amplitude and/or phase of the envelope signal by adjusting the amplitude and/or phase of the received signal (e.g. the radio frequency (RF) input signal, the output signal of the amplifier stack, the output signal of the amplifier circuit). The processor 1060 may adjust the amplitude and/or phase of the envelope signal by adjusting the amplitude and/or phase of the envelope signal which is detected by the processor 1060. The processor 1060 may include any type of amplitude and/or phase adjusting methods, functions, or circuits. The processor 1060 may include an amplifier block 1062 to adjust the amplitude and/or phase of the envelope signal.

The amplifier block 1062 may include an operational amplifier, an amplifier circuit, a delay circuit, and the processor 1060 may be configured to adjust the amplitude and/or phase of the envelope signal in accordance with one or more predetermined parameters. The amplitude and/or phase of the envelope signal may be adjusted so that the input control signal to be provided at the common gate terminals of the transistors of the amplifier stack and the radio frequency (RF) signal is canceled out at the common gate terminals of the transistors of the amplifier stack.

The processor 1060 may receive a feedback signal from the amplifier, and/or from the amplifier stack to adjust the amplitude and/or phase of the envelope signal based on the feedback signal. The processor 1060 may be configured to adjust the amplitude and/or phase of the received signal based on a bias voltage of the amplifier stack, or at least one bias voltage of the first transistor 1033 and/or the second transistor 1035 of the amplifier stack. The feedback signal may include an indication of a bias voltage of the amplifier stack, or at least one bias voltage of the first transistor 1033 and/or the second transistor 1035 of the amplifier stack. The processor 1060 may receive a feedback signal from an output of the amplifier circuit to adjust the amplitude and/or phase of the envelope signal based on the feedback signal. The amplifier block 1062 may be configured to provide a threshold for the input control signal based on the envelope signal.

The feedback signal may include an indication of the cross voltage between the gate terminal and the source terminal of the first transistor 1033 and/or the second transistor 1035 to be used to keep the cross voltage between the gate terminal and the source terminal of at least one of the first transistor 1033 and/or the second transistor 1035 substantially constant, and/or to reduce the cross voltage between the gate terminal and the drain terminal of the first transistor 1033 and/or the second transistor 1035. The feedback signal may include an indication of the gain of the amplifier stack, and/or an indication for the ratio of the capacitance of the gate-source terminals and/or the capacitance of the drain-source terminals of the first transistor 1033 and/or the second transistor 1035.

The processor 1060 may be configured to receive at least two signals and perform different adjustments in amplitude and/or phase. The processor 1060 may provide a first adjustment in amplitude and/or phase to the received signal, and provide a first input control signal to the first transistor 1033 of the amplifier stack, and the processor 1060 may provide a second adjustment in amplitude and/or phase to the received signal, and provide a second input control signal to the second transistor 1035 of the amplifier stack.

The provided first adjustment in amplitude and/or phase may include changing at least one of amplitude or phase of the received signal with a first parameter, and the provided second adjustment in amplitude and/or phase may include changing at least one of the amplitude or phase of the received signal with a second parameter. The first input control signal and the second control signal may be different according to at least one of their amplitudes or phases.

The processor 1060 may be configured to provide the first adjustment in amplitude and/or phase based on a first feedback signal, and the processor 1060 may be configured to provide the second adjustment in amplitude and/or phase based on a second feedback signal. The processor 1060 may be configured to provide the first adjustment in amplitude and/or phase and the second adjustment in amplitude and/or phase based on a predetermined plurality of parameters.

The processor 1060 may receive a first received signal based on a first differential portion of the radio frequency (RF) input signal provided to the first transistor 1003 of the amplifier, and a second received signal based on a second differential portion of the radio frequency (RF) input signal provided to the second transistor 1005 of the amplifier. The processor 1060 may receive a first received signal based on a first differential portion of the output signal of the amplifier stack, and a second received signal based on a second differential portion of the output signal of the amplifier stack. The processor 1060 may be coupled to the drain terminal of the first transistor 1033 of the amplifier stack to receive the first differential portion of the output signal of the amplifier stack. The processor 1060 may be coupled to the drain terminal of the second transistor 1035 of the amplifier stack to receive the second differential portion of the output signal of the amplifier stack.

Accordingly, the processor 1060 may adjust the amplitude and/or phase of the first received signal to obtain the first input control signal, and adjust the amplitude and/or phase of the second received signal to obtain the second input control signal. The processor 1060 may provide the first adjustment in amplitude and/or phase to the first received signal to obtain the first input control signal, and the processor 1060 may provide the second adjustment in amplitude and/or phase to the second received signal to obtain the second control signal.

The processor 1060 may include a low pass filter 1063, and the processor 1060 may provide an unfiltered input control signal to the low pass filter. Accordingly, the low pass filter 1063 may filter out the noise and spurs which would fall to the filtered portion of the frequency band, and may provide the input control signal to the amplifier stack.

Accordingly, the processor 1060 may provide the input control signal after adjusting the amplitude and/or phase of the envelope signal based on the received signal. The input control signal may include the envelope of the input signal with an adjusted amplitude and/or phase. Alternatively, the processor 1060 may receive the output signal of the amplifier and may adjust the amplitude and/or phase of the output signal of the amplifier and may provide the input control signal including the envelope of the output signal of the amplifier with an adjusted amplitude and/or phase. The processor 1060 may receive the output signal of the amplifier circuit, adjust the amplitude and/or phase of the output signal of the amplifier circuit, and provide the input control signal including the envelope of the output signal of the amplifier circuit with an adjusted amplitude and/or phase.

The amplifier circuit may include a plurality of amplifier stacks which are equal to the amplifier stack and which are coupled to the amplifier stack but before the matching block 1050, exemplarily including transistors which are coupled to the first transistor 1003 and second transistor 1005 of the amplifier in a cascode configuration respectively. At least one of the plurality of amplifier stacks may be coupled to the processor 1060 to receive an input control signal to control transistors of the respective amplifier stacks in a manner similar to the control provided for the amplifier stack.

Figure 11:
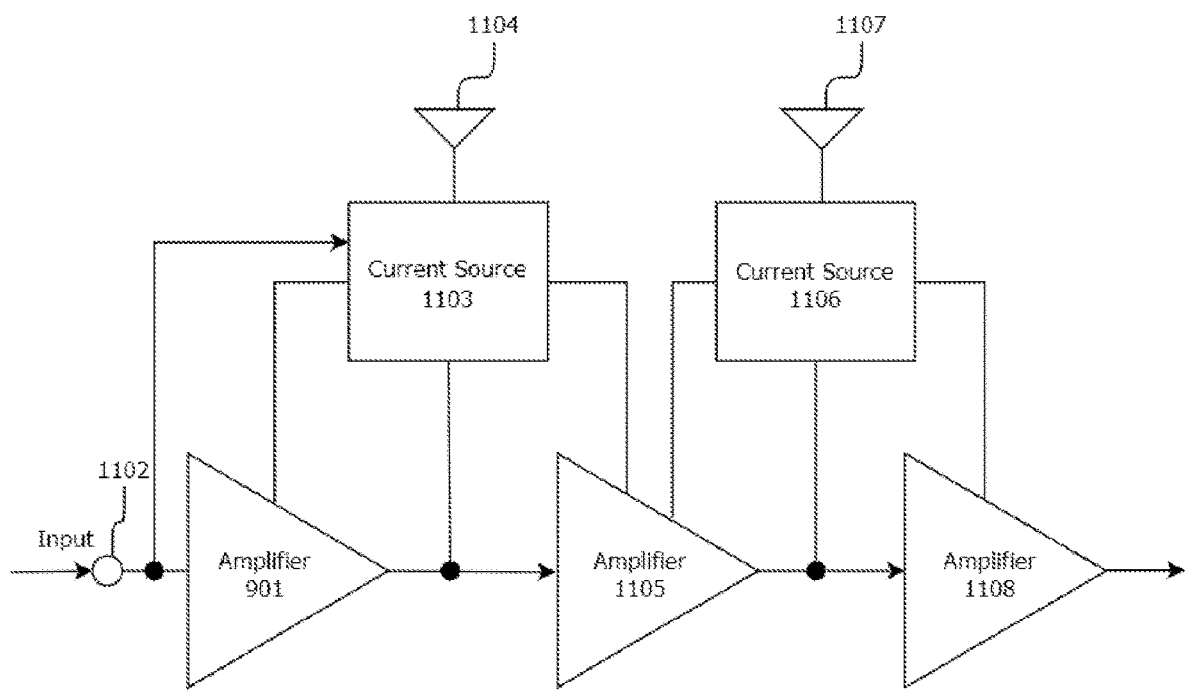
FIG. 11 shows schematically an example of an amplifier circuit including three amplifiers.

FIG. 11 shows schematically an example of an amplifier circuit including three amplifiers. The amplifier circuit may include a first amplifier 1101, a first current source 1103, a second amplifier 1105, a second current source 1106, and a third amplifier 1108. Various aspects that are provided in accordance with FIG. 9 in this disclosure may also apply to FIG. 11, e.g. in relation to the amplifiers 1101, 1105, 1108, and the current sources 1103, 1106. The first amplifier 1101 may be coupled to an input terminal 1102 to receive an input signal. The first amplifier 1101 provides a first output signal from its output and the first output signal may include an alternative current (AC) component based on the input signal and a direct current (DC) component. The first amplifier 1101 may be coupled to a first current source 1103 to receive an electrical current to supply the amplifier 1101.

The second amplifier 1105 may be an amplifier stack that is configured to receive the first output signal from the first amplifier 1101 and to provide a second output signal including the amplified first output signal. The second amplifier 1105 may be coupled to the first current source 1103. The third amplifier 1108 may an amplifier stack that is configured to receive the second output signal from the second amplifier 1105 and to provide a third output signal including the amplified second output signal. The third amplifier 1108 may be coupled to the second current source 1106.

The first current source 1103 may be configured to receive an input signal from the input terminal 1102 and an electrical supply from a first electrical supply terminal 1104. The first current source 1103 may be configured to receive the input signal which the amplifier 1101 also receives. The first current source 1103 may include a first shunt circuit. The first shunt circuit may be coupled to the first electrical supply terminal 1104 and the first shunt circuit may be configured to shunt a portion of an input current at the first electrical supply terminal 1104. Accordingly, the input current at the first electrical supply terminal 1104 may be divided into a first input current and a second input current.

The first current source 1103 may receive the first input current as the electrical supply, and the first shunt circuit may provide the second input current to a ground terminal. Alternatively, the first shunt circuit may provide the second input current to another component. Accordingly, an electrical supply less than the electrical supply provided at the first electrical supply terminal 1104 may be provided to the first current source 1103 as the electrical supply. The first shunt circuit may be configured to shunt the portion of the input current based on the supply voltage at the first electrical supply terminal 1104. Furthermore, the first shunt circuit may be configured to shunt the portion of the input current at the first electrical supply terminal 1104 based on the input signal, or direct current (DC) component of the input signal.

The second current source 1106 may be configured to receive an electrical supply from a second electrical supply terminal 1107. Further, the second current source 1106 may be configured to receive an input signal from the input terminal 1102. Alternatively, the second current source 1106 may be configured to receive an input signal from the output of the second amplifier 1105. The second current source 1103 may include a second shunt circuit. The second shunt circuit may be coupled to the second electrical supply terminal 1107 and the second shunt circuit may be configured to shunt a portion of an input current at the second electrical supply terminal 1107. Accordingly, the input current at the second electrical supply terminal 1107 may be divided into a first input current and a second input current.

The second current source 1106 may receive the first input current as the electrical supply, and the second shunt circuit may provide the second input current to a ground terminal. Alternatively, the second shunt circuit may provide the second input current to another component. Accordingly, an electrical supply less than the electrical supply provided at the second electrical supply terminal 1107 may be provided to the second current source 1106 as the electrical supply. The second shunt circuit may be configured to shunt the portion of the input current based on the supply voltage at the second electrical supply terminal 1107. Furthermore, the second shunt circuit may be configured to shunt the portion of the input current at the second electrical supply terminal 1107 based on the received input signal, or direct current (DC) component of the received input signal.

Accordingly, the first current source 1103 may be configured to receive a first electrical supply, and the second current source 1106 may be configured to receive a second electrical supply based on the input signal. Alternatively, the first current source 1103 may be configured to receive a first electrical supply as the electrical supply based on the input signal of the amplifier circuit, and the second current source 1106 may be configured to receive a second electrical supply as the electrical supply based on the first output signal. The shunt circuit of the first current source 1103 may be configured to shunt a first shunt current, and the shunt circuit of the second current source 1106 may be configured to shunt a second shunt current.

Figure 12:
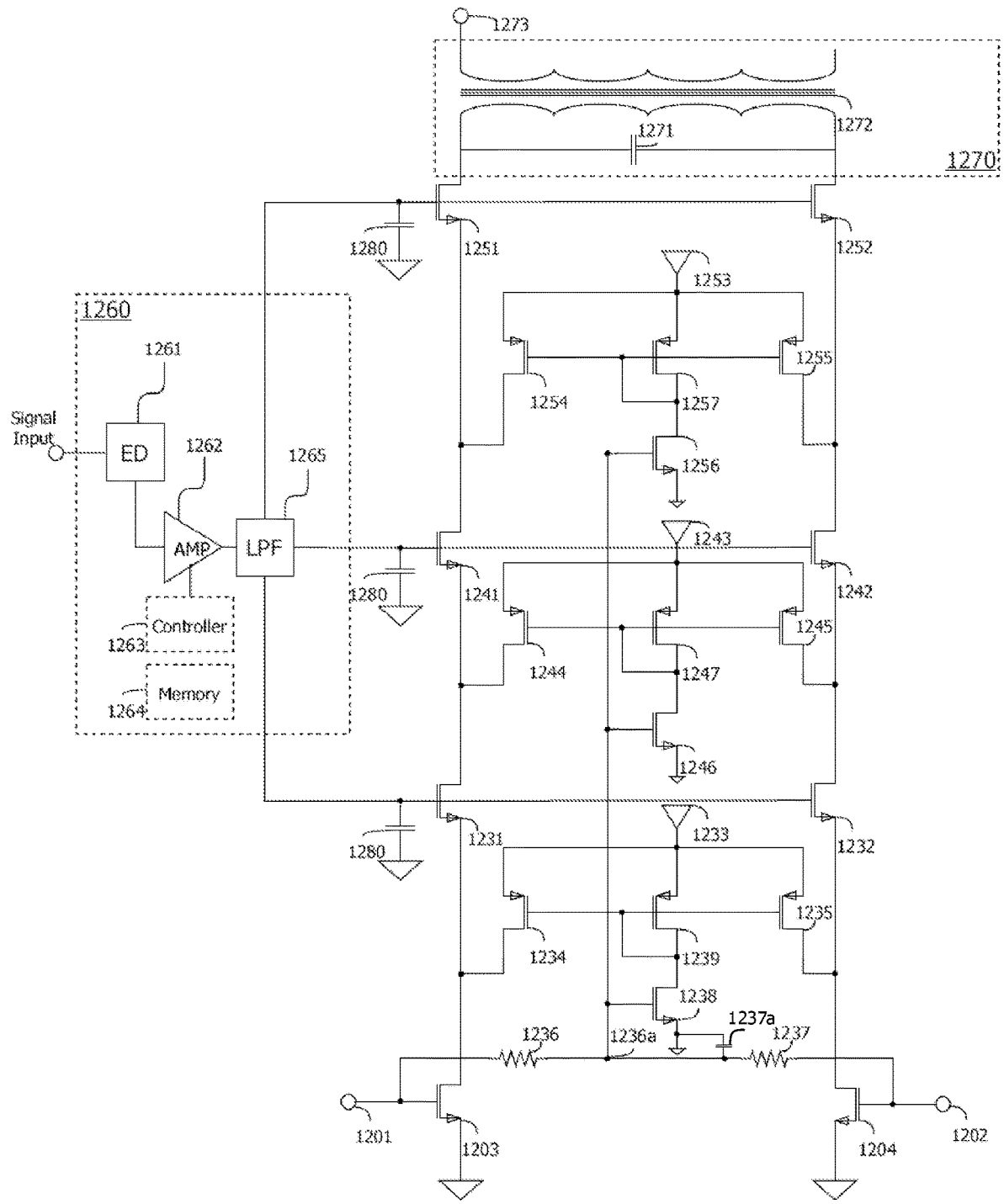
FIG. 12 shows schematically an example of an amplifier circuit.

FIG. 12 shows schematically an example of an amplifier circuit in accordance with various aspects of this disclosure. The amplifier circuit may include an amplifier, a first current source, a first amplifier stack, a second current source, a second amplifier stack, a third current source, a third amplifier stack, a processor 1260, and a matching block 1270. Aspects which are provided in this disclosure, e.g. the aspects in accordance with FIG. 10 and FIG. 11 may also apply to FIG. 12. The amplifier circuit may alternatively be coupled to a processor of a radio communication circuit. When the amplifier circuit is coupled to the processor of the radio communication circuit, the processor of the radio communication circuit may perform similar aspects with the processor 1260. In other words, the processor of the radio communication circuit may include the processor 1260.

The amplifier may include a transconductance amplifier in a differential configuration. The amplifier includes two input terminals, a first input terminal 1201 and a second input terminal 1202 which are configured to receive a radio frequency (RF) input signal in differential pairs. The first input terminal 1202 is coupled to a gate terminal of a first transistor 1203. The second input terminal may be coupled to a gate terminal of a second transistor 1204. The first transistor 1203 and the second transistor 1204 may include an N-type metal-oxide semiconductor (NMOS).

The first amplifier stack includes a first transistor 1231 and a second transistor 1232 arranged in a differential configuration. The first transistor 1231 of the first amplifier stack and the second transistor 1232 of the first amplifier stack are coupled to the amplifier to receive an output signal of the amplifier. The first transistor 1231 of the first amplifier stack is coupled to the first transistor 1203 of the amplifier. The source terminal of the first transistor 1231 of the first amplifier stack is coupled to the drain terminal of the first transistor 1203 of the amplifier. The second transistor 1232 of the first amplifier stack is coupled to the second transistor 1204 of the amplifier. The source terminal of the second transistor 1232 of the first amplifier stack is coupled to the drain terminal of the second transistor 1204 of the amplifier. The first transistor 1231 of the first amplifier stack and the second transistor 1232 of the first amplifier stack include N-type metal-oxide-semiconductor (NMOS).

The first current source may include an electrical supply terminal 1233. The first current source is coupled to the electrical supply terminal 1233 to receive the electrical supply which may be provided as a supply voltage. The first current source includes a first current source transistor 1234, and a second current source transistor 1235. A drain terminal of the first current source transistor 1234 is coupled to the source terminal of the first transistor 1231 of the first amplifier stack, and a drain terminal of the second current source transistor 1235 is coupled to the source terminal of the second transistor 1232 of the first amplifier stack. The first current source transistor 1234 the second current source transistor 1235 include P-type metal-oxide-semiconductor (PMOS).

The first current source is coupled to the amplifier, and the first current source may include a first supply circuit. The supply circuit includes a first resistor 1236, and a second resistor 1237. The first resistor 1236 and the second resistor 1237 are configured to receive the radio frequency (RF) input signal. The first input terminal 1201 may be coupled to the first resistor 1236 to provide the first differential pair of the radio frequency (RF) input signal to the first resistor 1236. The second input terminal 1202 may be coupled to the second resistor 1237 to provide the second differential pair of the radio frequency (RF) input signal to the second resistor 1237.

The first current source may further include, a first supply transistor 1238 coupled to a coupling node 1236a from a gate terminal, and the first resistor 1236 and the second resistor 1237 may be coupled to each other at the coupling node 1236a. A capacitor 1237a that is coupled to the ground may be coupled to the coupling node 1236a. The first supply transistor 1238 includes N-type metal-oxide-semiconductor (NMOS).

The second supply transistor 1239 may be coupled to the electrical supply terminal 1233 from its source terminal, and the drain terminal of the second supply transistor 1239 may be coupled to the first supply transistor 1238 which is configured to receive the differential voltage between the first input terminal 1201 and the second input terminal 1202. The second supply transistor 1239 includes P-type metal-oxide-semiconductor (PMOS). The drain terminal of the second supply transistor 1239 is coupled to a gate terminal of the first supply transistor 1238, which the gate terminal of the second supply transistor 1239 is coupled to a gate terminal of the first transistor 1231 of the first amplifier stack, and a gate terminal of the second transistor 1232 of the amplifier stack.

Accordingly, the first current source may be configured to divide the direct current (DC) signal flowing from the amplifier to the first amplifier stack. Further, the first current source may be configured to shunt a portion of the direct current (DC) signal flowing from the amplifier to the first amplifier stack. The first current source is configured to shunt the portion of the direct current (DC) signal based on the input signal.

The second amplifier stack and the third amplifier stack may be configured in a similar manner to the first amplifier stack. The second amplifier stack includes a first transistor 1241 and a second transistor 1242 arranged in a differential configuration to receive an output signal of the first amplifier stack. The source terminal of the first transistor 1241 of the second amplifier stack is coupled to the drain terminal of the first transistor 1231 of the first amplifier stack. The source terminal of the second transistor 1242 of the second amplifier stack is coupled to the drain terminal of the second transistor 1232 of the first amplifier stack.

The second current source is coupled to the first amplifier stack and the second amplifier stack, and the second current source includes a first current source transistor 1244, and a second current source transistor 1245. A drain terminal of the first current source transistor 1244 is coupled to the source terminal of the first transistor 1241, and a drain terminal of the second current source transistor 1245 is coupled to the source terminal of the second transistor 1242. The first current source transistor 1244 the second current source transistor 1245 include P-type metal-oxide-semiconductor (PMOS). Further, the second current source may include a second supply circuit. The second supply circuit includes a first supply transistor 1246 configured to receive an input signal based on the input signal of the amplifier circuit from a gate terminal. Exemplarily, the gate terminal is coupled to the coupling node 1236*a*. The second supply circuit may include a second supply transistor 1247. The first supply transistor 1246 includes an N-type metal-oxide-semiconductor (NMOS) and the second supply transistor 1247 includes a P-type metal-oxide-semiconductor (PMOS).

Accordingly, the second current source may be configured to divide the direct current (DC) signal flowing from the first amplifier stack to the second amplifier stack. Further, the second current source may be configured to shunt a portion of the direct current (DC) signal flowing from the first amplifier stack to the second amplifier stack. The second current source is configured to shunt the portion of the direct current (DC) signal based on the input signal.

The third amplifier stack includes a first transistor 1251 and a second transistor 1252 arranged in a differential configuration to receive an output signal of the second amplifier stack. The source terminal of the first transistor 1251 of the third amplifier stack is coupled to the drain terminal of the first transistor 1241 of the second amplifier stack. The source terminal of the second transistor 1252 of the third amplifier stack is coupled to the drain terminal of the second transistor 1242 of the second amplifier stack.

The third current source is coupled to the second amplifier stack, and the current source includes a first current source transistor 1254, and a second current source transistor 1255. A drain terminal of the first current source transistor 1254 is coupled to the source terminal of the first transistor 1251, and a drain terminal of the second current source transistor 1255 is coupled to the source terminal of the second transistor 1252. The first current source transistor 1254 and the second current source transistor 1255 include P-type metal-oxide-semiconductor (PMOS). Further, the third current source may include a third supply circuit. The third supply circuit includes a first supply transistor 1256 configured to receive an input signal based on the input signal of the amplifier circuit from a gate terminal. The gate terminal may be coupled to the coupling node 1236*a*. The third supply circuit may include a second supply transistor 1257. The first supply transistor 1256 includes an N-type metal-oxide-semiconductor (NMOS) and the second supply transistor 1257 includes a P-type metal-oxide-semiconductor (PMOS).

Accordingly, the third current source may be configured to divide the direct current (DC) signal flowing from the second amplifier stack to the third amplifier stack. Further, the third current source may be configured to shunt a portion of the direct current (DC) signal flowing from the second amplifier stack to the third amplifier stack. The third current source is configured to shunt the portion of the direct current (DC) signal based on the input signal.

The amplifier circuit may be configured such that DC currents that are configured to flow through the first transistor 1203 and the second transistor 1204 of the amplifier at respective operations for a differential amplifier, may be K times of a DC current that is configured to flow through the first supply transistor 1238 of the first current source. The amplifier circuit may be configured such that DC currents that are configured to flow through the first transistor 1231 and the second transistor 1232 of the first amplifier stack at respective operations for a differential amplifier, may be K times of a DC current that is configured to flow through the first supply transistor 1246 of the second current source. The amplifier circuit may be configured such that DC currents that are configured to flow through the first transistor 1241 and the second transistor 1242 of the second amplifier stack at respective operations for a differential amplifier, may be K times of a DC current that is configured to flow through the first supply transistor 1256 of the third current source.

Accordingly, the first supply transistors 1238, 1246, 1256 of the first current source, the second current source, and the third current source may have the width of W, and each of the first transistors 1203, 1231, 1241, and the second transistors 1204, 1235, 1245 of the amplifier, the first amplifier stage, and the second amplifier stage respectively may have a width of K*W, while the length L of each of these transistors are substantially equal.

Furthermore, the amplifier circuit may be configured such that DC currents that are configured to flow through a first current source transistor 1234, 1244, 1254 and a second current source transistor 1235, 1245, 1255 at respective operations for a differential amplifier, may be P times of a DC current that is configured to flow through the respective second supply transistor 1239, 1247, 1257. Accordingly, the DC current provided by a first current source transistor 1234, 1244, 1254 and/or a respective second current source transistor 1235, 1245, 1255 at respective operations may be P/K of the DC current of the first transistor 1203, 1231, 1241 and/or the second transistor 1204, 1232, 1242 of the amplifier, the first amplifier stack and the second amplifier stack respectively.

The processor 1260 is configured to detect an envelope signal of a received signal. The processor 1260 may include an envelope detector 1261 configured to detect an envelope signal of a received signal. The processor 1260 may further adjust the amplitude and/or phase of the envelope signal. The processor 1260 may adjust the amplitude and/or phase of the envelope signal to align the envelope signal to an envelope of the signal flowing through the source and drain terminals of the respective transistors 1231, 1232, 1241, 1242, 1251, 1252 of each of the amplifier stacks. The processor 1260 may adjust the amplitude and/or phase of the envelope signal so that the gate-source and gate-drain cross voltages of the respective transistors 1231, 1232, 1241, 1242, 1251, 1252 of each of the amplifier stacks, in terms of envelopes of these signals become flatter. The processor 1260 may adjust the amplitude and/or phase of the envelope signal to increase the correlation between the envelope of the signal between the gate-source terminals and the gate-drain terminals of the respective transistors 1231, 1232, 1241, 1242, 1251, 1252 of each of the amplifier stacks.

The processor 1260 may adjust the amplitude and/or phase of the envelope signal to provide a first input control signal to the first amplifier stack, a second input control signal to the second amplifier stack, and a third input control signal to the third amplifier stack (and further input control signals for other amplifier stacks) the respective transistors 1231, 1232, 1241, 1242, 1251, 1252 of each of the amplifier stacks in order to increase the correlation between the envelope of the signal between the gate-source terminals and the gate-drain terminals of the respective transistors, and/or in order to keep the gain of the respective stack amplifier linear or constant, and/or in order to keep the ratio of the capacitance of the gate-source terminals and the capacitance of the drain-source terminals of the respective transistor linear or constant, and/or in order to reduce the memory effects for the respective amplifier stack.

The processor 1260 may adjust the amplitude and/or phase of the envelope signal in order to keep the cross voltage between the gate terminal and source terminal of at least one of the transistors of the plurality of amplifier stacks substantially constant. The processor 1260 may adjust the amplitude and/or phase of the envelope signal in order to reduce the cross voltage between the gate terminal and drain terminal of at least one of the transistors of the plurality of amplifier stacks substantially constant.

The processor 1260 may adjust the amplitude and/or phase of the envelope signal by adjusting the amplitude and/or phase of the received signal (e.g. the radio frequency (RF) input signal, the output signal of an amplifier stack, the output signal of the amplifier circuit). The processor 1260 may adjust the amplitude and/or phase of the envelope signal by adjusting the amplitude and/or phase of the envelope signal which is detected by the processor 1260. The processor 1260 may include any type of amplitude and/or phase adjusting methods, functions, or circuits. The processor 1260 includes an amplifier block 1262 to adjust the amplitude and/or phase of the envelope signal.

The processor 1260 may include a controller 1263 and a memory 1264. The controller 1263 may be configured to control the amplifier block 1262 of the processor 1260 to adjust the amplitude and/or phase of the received signal. The controller 1263 may determine to adjust the amplitude and/or phase of the envelope signal in accordance with one or more predetermined parameters. The predetermined parameters are stored in the memory 1264. Accordingly, the controller 1263 determines an adjustment to be provided in the amplitude and/or phase of the envelope signal based on the predetermined parameters stored in the memory 1264.

The first input control signal to be provided to a first transistor of an amplifier stack and the second control signal to be provided to a second transistor of an amplifier stack have a phase difference of 180 degrees. In other words, the first input control signal and the second input control signal are 180 degrees out of phase signals. Such out-of-phase difference existing at gate terminals of the respective transistors may lower the dynamic voltage stress to improve the reliability.

The controller 1263 may receive a feedback signal from the amplifier, and/or from one of the amplifier stacks, and the controller 1263 may determine an adjustment to be provided in the amplitude and/or phase of the envelope signal based on the feedback signal.

The controller 1263 may receive at least one of: an amplifier feedback signal indicating a first bias voltage of at least one of the first transistor 1203 and the second transistor 1204 of the amplifier, and a first feedback signal indicating a second bias voltage of at least one of the first transistor 1231 and the second transistor 1232 of the first amplifier stack, and a second feedback signal indicating a third bias voltage of at least one of the first transistor 1241 and the second transistor 1242 of the second amplifier stack, and a third feedback signal indicating a fourth bias voltage of at least one of the first transistor 1251 and the second transistor 1252 of the third amplifier stack.

Exemplarily, the feedback signal may include an indication of the cross voltage between the gate terminal and the source terminal of the first transistor 1231 and/or the second transistor 1232. The feedback signal may include an indication of the gain of the amplifier stack, and/or an indication for the ratio of the capacitance of the gate-source terminals and/or the capacitance of the drain-source terminals of the first transistor 1231 and/or the second transistor 1232.

The controller 1263 may determine the adjustment to be provided in amplitude and/or phase of the received signal to provide an input control signal to be provided to an amplifier stack based on the received feedback signal from the respective amplifier stack. Exemplarily, the controller 1263 may determine the adjustment to be provided in amplitude and/or phase of the received signal to provide a first input control signal to the first amplifier stack based on the first feedback signal. The controller 1263 may determine the adjustment to be provided in amplitude and/or phase of the received signal to provide an input control signal to be provided to an amplifier stack based on the combination of at least two received feedback signals. Exemplarily, the controller 1263 may determine the adjustment to be provided in amplitude and/or phase of the received signal to provide a first input control signal to the first amplifier stack based on the first feedback signal and the amplifier feedback signal. The controller 1263 may provide a threshold for the input control signal based on the envelope signal.

The controller 1263 may be configured to perform different adjustments in amplitude and/or phase. The controller 1263 may provide a first adjustment in amplitude and/or phase to the received signal, and the processor 1260 may provide a first input control signal to the first amplifier stack; and the controller 1263 may provide a second adjustment in amplitude and/or phase to the received signal, and the processor 1260 may provide a second input control signal to the second amplifier stack.

The provided first adjustment in amplitude and/or phase may include changing at least one of amplitude or phase of the received signal with a first parameter, and the provided second adjustment in amplitude and/or phase may include changing at least one of the amplitude or phase of the received signal with a second parameter. The first input control signal and the second control signal may be different according to at least one of their amplitudes or phases.

The processor 1260 may receive a first received signal based on a first differential portion of the radio frequency (RF) input signal provided to the first transistor 1203 of the amplifier, and a second received signal based on a second differential portion of the radio frequency (RF) input signal provided to the second transistor 1204 of the amplifier. The processor 1260 may receive a first received signal, and a second received signal based on differential portions of the output signal of any one of the amplifiers or the amplifier stacks.

Accordingly, the controller 1263 may determine a first adjustment in amplitude and/or phase of the first received signal to obtain the first input control signal, and a second adjustment in amplitude and/or phase of the second received signal to obtain the second input control signal in accordance with various aspects of this disclosure. The amplifier block 1262 may provide the first adjustment in amplitude and/or phase to the first received signal to obtain the first input control signal, and the amplifier block 1262 may provide the second adjustment in amplitude and/or phase to the second received signal to obtain the second control signal.

The processor 1260 may include a low pass filter 1265, and the amplifier block 1262 provides an unfiltered input control signal to the low pass filter. Accordingly, the low pass filter 1265 may filter out the noise and spurs which would fall to the filtered portion of the frequency band and provides the input control signal to the respective amplifier stack.

Accordingly, the processor 1260 may provide an input control signal after adjusting the amplitude and/or phase of the envelope signal based on a received signal. The input control signal may include the envelope of the input signal with an adjusted amplitude and/or phase. Alternatively, the processor 1260 may receive the output signal of the amplifier and may adjust the amplitude and/or phase of the output signal of the amplifier and may provide the input control signal including the envelope of the output signal of the amplifier with an adjusted amplitude and/or phase. In another example, the processor 1260 may receive an output signal of any one of the amplifier stacks, and/or the output signal of the amplifier circuit and may adjust the amplitude and/or phase of the received signal and provides the input control signal including the envelope of the received signal with an adjusted amplitude and/or phase.

The matching block 1270 may be coupled to the output of the third amplifier stack to match the impedance. The matching block 1270 may include a capacitor coupled to the third amplifier stack and a transformer 1272. The matching block 1270 may further include an output to provide 1273 the output signal of the amplifier circuit. The amplifier circuit may include the matching block 1270.

Figure 13:
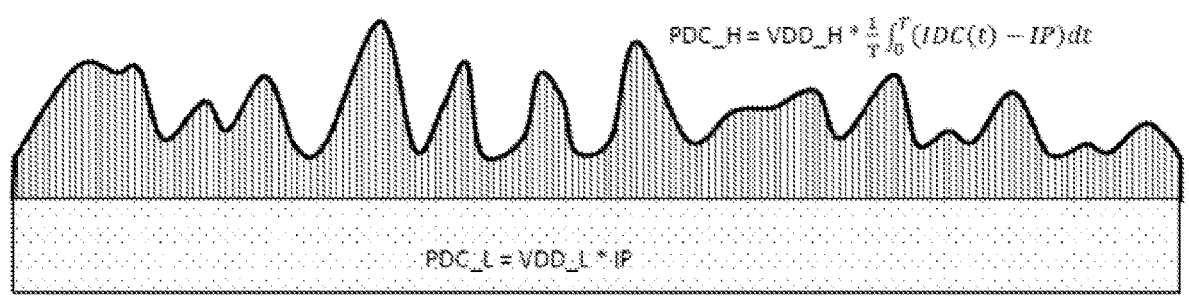
FIG. 13 shows schematically a diagram of DC power supply for an amplifier circuit.

FIG. 13 shows schematically an exemplary diagram of direct current (DC) power consumption of an amplifier circuit including a current source including P-type metal-oxide-semiconductor transistors (PMOS) coupled to an amplifier. The PDC_L represents the power supply provided by the current source, VDD_L represents the supply voltage coupled to the current source, PDC_H represents the power supply provided to the amplifier circuit, and VDD_H represents the supply voltage coupled to the amplifier circuit.

In an example, a radio communication circuit may include an up-converter configured to upconvert a baseband communication signal to a radio frequency (RF) communication signal, and an amplifier circuit in accordance with various aspects of this disclosure which receives the radio frequency (RF) communication signal. A radio communication device may include the radio communication circuit including an amplifier circuit in accordance with various aspects of this disclosure, and an antenna configured to transmit an output signal provided by the amplifier circuit. The radio communication device may include a baseband processor configured to provide the baseband communication signal.

In an example, a radio communication device may include, a computer-readable medium including instructions stored thereon, that if executed by a processor, implement a method including: amplifying an input signal to provide an output signal by an amplifier, wherein the output signal includes a direct current (DC) signal, providing an electrical supply to divide the direct current (DC) signal of the output signal based on the electrical supply. A device, e.g. a communication device may include a memory, and one or more processors, such as processing circuitry 402 and memory 403 referring back to FIG. 4. The memory 403 may be implemented as a computer-readable medium including instructions stored thereon, that if executed by a processor implement a method including: amplifying an input signal to provide an output signal by an amplifier, wherein the output signal may include a direct current (DC) signal, providing an electrical supply to divide the direct current (DC) signal of the output signal based on the electrical supply.

Figure 14:
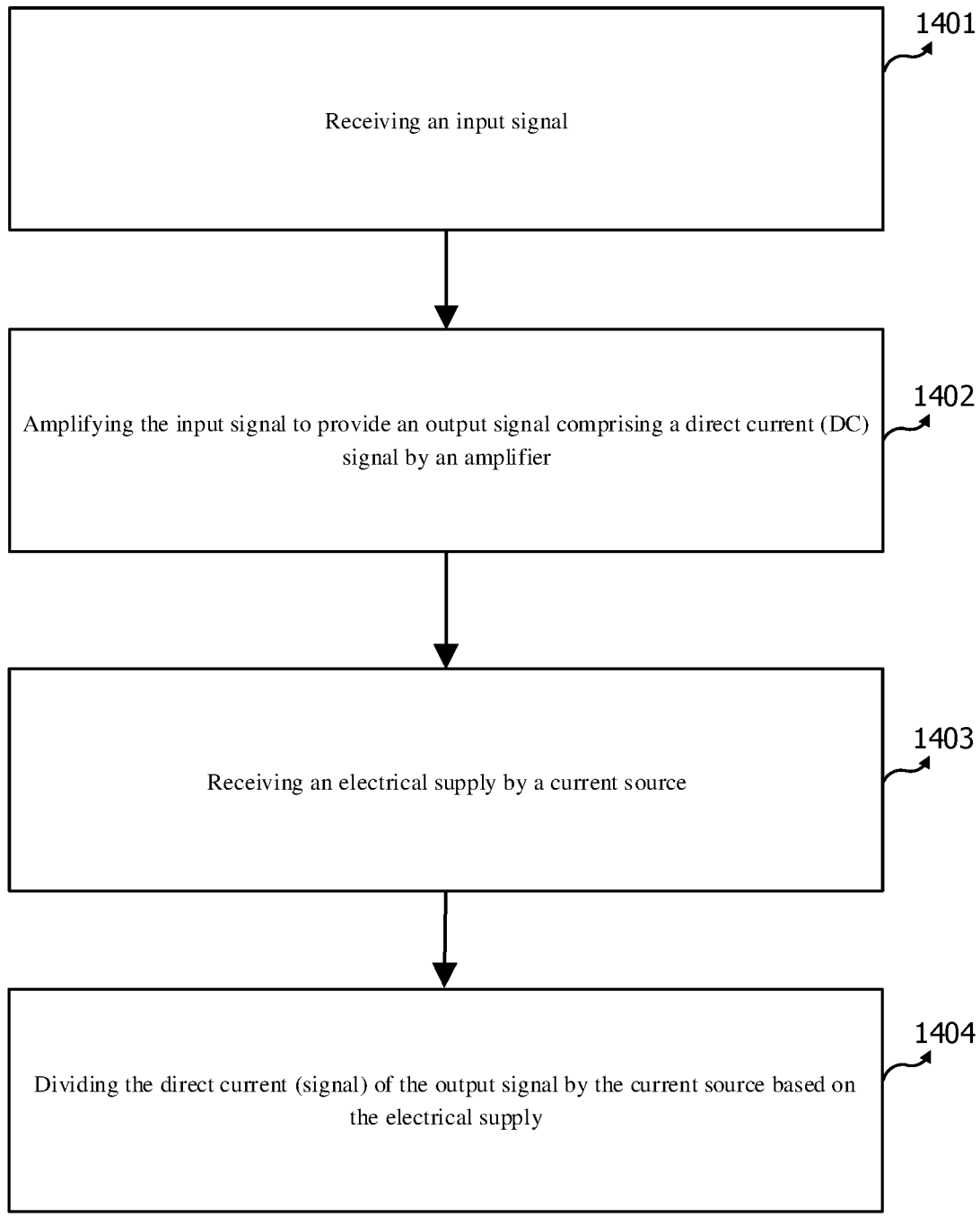
FIG. 14 shows schematically an example of a method.

FIG. 14 shows schematically an example of a method. The method includes receiving an input signal; amplifying the input signal to provide an output signal comprising a direct current (DC) signal by an amplifier; receiving an electrical supply by a current source; dividing the direct current (signal) of the output signal by the current source based on the electrical supply.

The following examples pertain to further aspects of this disclosure.

Example 1 includes a subject matter of an amplifier circuit. The subject matter includes an amplifier configured to amplify an input signal to provide an output signal, and the output signal includes a direct current (DC) signal; a current source coupled to the amplifier, the current source configured to receive an electrical supply; and divide the direct current (DC) signal of the output signal based on the electrical supply.

In example 2, the subject matter of example 1, can optionally include that the current source is coupled to a voltage source to receive the electrical supply, and the current source is configured to partially shunt the direct current (DC) signal of the output signal based on the input signal. In example 3, the subject matter of example 1 or example 2, can optionally include that the current source is configured to receive the electrical supply based on the input signal. In example 4, the subject matter of example 3, can optionally include that the current source is configured to receive the electrical supply based on a direct current (DC) component of the input signal.

In example 5, the subject matter of any one of examples 1 to 4, can optionally include that the current source includes a shunt circuit configured to shunt a portion of the direct current (DC) signal of the output signal based on the input signal. In example 6, the subject matter of any one of examples 1 to 4, can optionally include that the current source includes a shunt circuit coupled to an electrical supply terminal to receive an input current, and can further include that the shunt circuit is configured to divide the input current to a first input current and a second input current based on the input signal, and can further include that the shunt circuit is configured to shunt the second input current.

In example 7, the subject matter of example 6, can optionally include that the shunt circuit is configured to shunt the second input current to a ground terminal. In example 8, the subject matter of example 6, can optionally include that the shunt circuit is configured to shunt the second input current to another component of the amplifier circuit. In example 9, the subject matter of any one of examples 6 to 8, can optionally include that the electrical supply includes the first input current.

In example 10, the subject matter of any one of examples 1 to 9, can optionally include that the current source is configured to supply the amplifier. In example 11, the subject matter of example any one of examples 1 to 10, may further include a voltage supply coupled to the current source, can optionally include that the voltage supply is configured to provide the electrical supply to the current source based on the input signal.

In example 12, the subject matter of any one of examples 1 to 11, can optionally include that the voltage supply coupled to the amplifier; and can further include that the voltage supply is configured to provide a first electrical supply to the amplifier; and can further include that the current source is configured to provide a second electrical supply to the amplifier.

In example 13, the subject matter of any one of examples 1 to 13, can optionally include that the amplifier includes a first transistor and a second transistor coupled in a differential configuration, the first transistor is configured to receive a first differential input signal from a first gate terminal, and the second transistor is configured to receive a second differential input signal from a second gate terminal.

In example 14, the subject matter of example 13, can optionally include that the electrical supply is provided to the current source based on a voltage between the first gate terminal and the second gate terminal. In example 15, the subject matter of example 14, can optionally include that the first gate terminal is coupled to a first resistor, and the second gate terminal is coupled to a second resistor, the first resistor is coupled to the second resistor at a first node, and the first node is coupled to the ground.

In example 16, the subject matter of example 15, can optionally include that a decoupling capacitor and/or a low pass filter is coupled to the first node. In example 17, the subject matter of example 16, may further include: a first supply transistor and a second supply transistor; can further include that the first node is coupled to a gate terminal of the first supply transistor, can further include that the first supply transistor includes a drain terminal coupled to the second supply transistor from a drain terminal of the second supply transistor, can further include that the second supply transistor is coupled to a voltage source by a source terminal of the second supply transistor.

In example 18, the subject matter of example 17, can optionally include that the amplifier is configured to have a current flowing through the first transistor is K times of a current configured to flow through the first supply transistor. In example 19, the subject matter of examples 17 or 18, can optionally include that the amplifier is configured to have a current flowing through the second transistor is K times of a current configured to flow through the first supply transistor.

In example 20, the subject matter of any one of examples 17 to 19, can optionally include that the current source includes a first current source transistor and a second current source transistor. In example 21, the subject matter of example 20, can optionally include that the first current source transistor is configured to have a first current source current flowing through the first current source transistor, and can further include that the first current source current is P times of a second supply transistor current that is configured to flow through the second supply transistor.

In example 22, the subject matter of example 21, may further include a second current transistor, and can optionally include that the first current source transistor and the second current source transistor include second P-type metal-oxide semiconductors, and the first transistor and the second transistor include N-type metal-oxide semiconductors. In example 23, the subject matter of example any one of examples 20 to 22, can optionally include that the first supply transistor includes an N-type metal-oxide semiconductor, and the second supply transistor includes a P-type metal-oxide semiconductor, and the drain terminal of the first supply transistor is coupled to a gate terminal of the first current source transistor, a gate terminal of the second current source transistor, and a gate terminal of the second supply transistor.

In example 24, the subject matter of any one of examples 17 to 23, can optionally include that the first supply transistor has a width smaller than the width of the first transistor and/or the second transistor, and the ratio of the width of the first supply transistor to the width of the first transistor and/or the second transistor is 1/K. In example 25, the subject matter of any one of examples 17 to 24, can optionally include that the first supply transistor and the first transistor and/or the second transistor have the substantially same length. In example 26, the subject matter of any one of examples 1 to 25, may further include an amplifier stack coupled to the current source and the amplifier, the amplifier stack configured to receive the output signal and amplify the output signal.

In example 27, the subject matter of example 26, can optionally include that the electrical supply includes a supply voltage signal adjustable to a first level supply voltage and a second level supply voltage, can optionally include that the first level supply voltage is lower than the second level supply voltage; the amplifier stack is configured to receive a supply voltage of the second level supply voltage when the supply voltage signal configured for the electrical supply is adjusted at the first level supply voltage.

In example 28, the subject matter of example 27, can optionally include that the amplifier stack includes a first amplifier stack transistor, and a second amplifier stack transistor coupled in a differential configuration, and can further include that a source terminal of the first amplifier stack transistor is coupled to the drain terminal of the first transistor of the amplifier and the drain terminal of the first current source transistor; can further include that a source terminal of the second amplifier stack transistor is coupled to the drain terminal of the second transistor of the amplifier and the drain terminal of the second current source transistor.

In example 29, the subject matter of example 28, can optionally include that the amplifier stack is configured to receive an input control signal to control characteristics of the first transistor of the amplifier and the second transistor of the amplifier based on an envelope of the input signal. In example 30, the subject matter of any one of examples 26 to 29, can optionally include that the current source is configured to supply the amplifier stack. In example 31, the subject matter of example any one of examples 26 to 30, may further include a plurality of amplifier stacks that may include a first amplifier stack that may include the amplifier stack configured to provide an amplifier stack output signal, can further include that the amplifier stack output signal includes an amplifier stack direct current (DC) signal; and a second amplifier stack coupled to the amplifier stack and a second current source, the second current source configured to receive a second electrical supply; divide the amplifier stack direct current (DC) signal of the amplifier stack output signal based on the electrical supply.

In example 32, the subject matter of example 31, can optionally include that the second current source is configured to receive a second current source input signal may include the input signal. In example 33, the subject matter of example 31, can optionally include that the second current source is configured to receive a second current source input signal may include the output signal of the amplifier. In example 34, the subject matter of example 32 or 33, can optionally include that the second current source is coupled to a voltage source to receive a second electrical supply, and the current second source is configured to partially shunt the direct current (DC) signal of the amplifier stack output signal based on the second current source input signal.

In example 35, the subject matter of example 34, can optionally include that the second current source is configured to receive the second electrical supply based on the second current source input signal. In example 36, the subject matter of example 35, can optionally include that the second current source is configured to receive the second electrical supply based on a direct current (DC) component of the second current source input signal. In example 37, the subject matter of any one of examples 31 to 36, can optionally include that the second current source includes a second shunt circuit configured to shunt a portion of the direct current (DC) signal of the amplifier stack output signal based on the input signal.

In example 38, the subject matter of any one of examples 33 to 36, can optionally include that the second current source includes a second shunt circuit coupled to a second electrical supply terminal to receive an input current, and can optionally include that the second shunt circuit is configured to divide the input current to a first input current and a second input current based on the second current source input signal, and can further include that the shunt circuit is configured to shunt the second input current.

In example 39, the subject matter includes a mobile radio communication circuit. The subject matter may include: an up-converter configured to up-convert a baseband communication signal to a radio frequency (RF) communication signal; and an amplifier circuit according to any one of examples 1 to 38 configured to receive the radio frequency (RF) communication signal as the input signal. In example 40, the subject matter of example 39, can optionally include that the current source is coupled to a voltage source to receive the electrical supply, and the current source is configured to partially shunt the direct current (DC) signal of the output signal based on the input signal.

In example 41, the subject matter includes a mobile radio communication device. The subject matter may include: a mobile radio communication circuit may include: an up-converter configured to up-convert a baseband communication signal to a radio frequency (RF) communication signal; and an amplifier circuit according to any one of examples 1 to 38 configured to receive the radio frequency (RF) communication signal as the input signal; an antenna configured to transmit an amplifier output signal provided by the amplifier circuit. In example 42, the subject matter of example 41, may further include: a baseband processor configured to provide the baseband communication signal.

In example 43 the subject matter is a method. The method may include: receiving an input signal; amplifying the input signal to provide an output signal may include a direct current (DC) signal by an amplifier; receiving an electrical supply by a current source; dividing the direct current (signal) of the output signal by the current source based on the electrical supply. In example 44, the subject matter of example 43, may further include: partially shunting the direct current (DC) signal of the output signal based on the input signal.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted. It should be noted that certain components may be omitted for the sake of simplicity. It should be noted that nodes (dots) are provided to identify the circuit line intersections in the drawings including electronic circuit diagrams.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

As used herein, a signal that is "indicative of" or "indicating" a value or other information may be a digital or analog signal that encodes or otherwise communicates the value or other information in a manner that can be decoded by and/or cause a responsive action in a component receiving the signal. The signal may be stored or buffered in computer-readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The terms "one or more processors" is intended to refer to a processor or a controller. The one or more processors may include one processor or a plurality of processors. The terms are simply used as an alternative to the "processor" or "controller".

As utilized herein, terms "module", "component," "system," "circuit," "element," "slice," "circuit," and the like are intended to refer to a set of one or more electronic components, a computer-related entity, hardware, software (e.g., in execution), and/or firmware. For example, circuit or a similar term can be a processor, a process running on a processor, a controller, an object, an executable program, a storage device, and/or a computer with a processing device. By way of illustration, an application running on a server and the server can also be circuit. One or more circuits can reside within the same circuit, and circuit can be localized on one computer and/or distributed between two or more computers. A set of elements or a set of other circuits can be described herein, in which the term "set" can be interpreted as "one or more."

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D Points, among others, or any combination thereof. Registers, shift registers, processor registers, data buffers, among others, are also embraced herein by the term memory. The term "software" refers to any type of executable instruction, including firmware.

The term "antenna", as used herein, may include any suitable configuration, structure and/or arrangement of one or more antenna elements, components, units, assemblies and/or arrays. The antenna may implement transmit and receive functionalities using separate transmit and receive antenna elements. The antenna may implement transmit and receive functionalities using common and/or integrated transmit/receive elements. The antenna may include, for example, a phased array antenna, a single element antenna, a set of switched beam antennas, and/or the like.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "provided" to an element, the voltage, current, or signal may be conducted to the element by way of a physical connection or by way of capacitive, electro-magnetic, or inductive coupling that does not involve a physical connection.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), Time-Division Multiplexing (TDM), Time-Division Multiple Access (TDMA), Multi-User MIMO (MU-MIMO), General Packet Radio Service (GPRS), extended GPRS (EGPRS), Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth (BT), Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

Some demonstrative aspects may be used in conjunction with a WLAN, e.g., a WiFi network. Other aspects may be used in conjunction with any other suitable wireless communication network, for example, a wireless area network, a "piconet", a WPAN, a WVAN and the like.

Some aspects may be used in conjunction with a wireless communication network communicating over a frequency band of 2.4 GHz, 5 GHz, and/or 6-7 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. An amplifier circuit comprising:
   an amplifier configured to amplify an input signal to provide an output signal, wherein the output signal comprises a direct current (DC) signal;
   a current source coupled to the amplifier, the current source configured to
      receive an electrical supply;
      divide the direct current (DC) signal of the output signal based on the electrical supply, wherein the current source comprises a shunt circuit configured to partially shunt the DC signal of the output signal in which an amount of shunted DC signal is based on the electrical supply.

2. The amplifier circuit of claim 1,
   wherein the current source is coupled to a voltage source to receive the electrical supply, and the current source is configured to partially shunt the direct current (DC) signal of the output signal based on the input signal.

3. The amplifier circuit of claim 1,
   wherein the current source is configured to receive the electrical supply based on the input signal.

4. The amplifier circuit of claim 1,
   wherein the amplifier comprises a first transistor and a second transistor coupled in a differential configuration, the first transistor is configured to receive a first differential input signal from a first gate terminal, and the second transistor is configured to receive a second differential input signal from a second gate terminal.

5. The amplifier circuit of claim 4,
   wherein the electrical supply is provided to the current source based on the voltage between the first gate terminal and the second gate terminal.

6. The amplifier circuit of claim 5,
   wherein the first gate terminal is coupled to a first resistor, and
   wherein the second gate terminal is coupled to a second resistor, and
   wherein the first resistor is coupled to the second resistor at a first node, and
   wherein the first node is coupled to the ground.

7. The amplifier circuit of claim 6,
   wherein a decoupling capacitor and/or a low pass filter is coupled to the first node.

8. The amplifier circuit of claim 7, further comprising a first supply transistor and a second supply transistor;
   wherein the first node is coupled to a gate terminal of the first supply transistor,
   wherein the first supply transistor comprises a drain terminal coupled to the second supply transistor from a drain terminal of the second supply transistor, and
   wherein the second supply transistor is coupled to a voltage source by a source terminal of the second supply transistor.

9. The amplifier circuit of claim 8,
   wherein the amplifier is configured to have a current flowing through the first transistor is K times of a current configured to flow through the first supply transistor.

10. The amplifier circuit of claim 9,
    wherein the current source is configured to have a current flowing through the first P-type metal-oxide semiconductor of the current source is P times of a current configured to flow through the second supply transistor.

11. The amplifier circuit of claim 8,
    wherein the current source comprises a first current source transistor and a second current source transistor, and
    wherein the first current source transistor comprises a P-type metal-oxide semiconductor,
    wherein the second current source transistor comprises a P-type metal-oxide semiconductor, and
    wherein the first transistor and the second transistor comprise N-type metal-oxide semiconductors coupled to the current source.

12. The amplifier circuit of claim 11,
    wherein the first supply transistor comprises an N-type metal-oxide semiconductor, and
    wherein the second supply transistor comprises a P-type metal-oxide semiconductor, and
    wherein the drain terminal of the first supply transistor is coupled to a gate terminal of the first P-type metal-oxide semiconductor, a gate terminal of the second P-type metal-oxide semiconductor, and a gate terminal of the second supply transistor.

13. The amplifier circuit of claim 12,
    wherein the first supply transistor has a width smaller than the width of the first transistor and/or the second transistor, and wherein the ratio of the width of the first supply transistor to the width of the first transistor and/or the second transistor is 1/K.

14. The amplifier circuit of claim 13, wherein the first supply transistor and the first transistor and/or the second transistor have the substantially same length.

15. The amplifier circuit of claim 1, further comprising an amplifier stack coupled to the current source and the amplifier, wherein the amplifier stack is configured to receive the output signal and amplify the output signal.

16. The amplifier circuit of claim 15, wherein the electrical supply comprises a supply voltage signal configured to be adjusted to a first level supply voltage and a second level supply voltage, and wherein the first level supply voltage is lower than the second level supply voltage, and wherein the amplifier stack is configured to receive a supply voltage of the second level supply voltage when the supply voltage signal configured for the electrical supply is adjusted at the first level supply voltage.

17. The amplifier circuit of claim 15, wherein the amplifier stack comprises a first amplifier stack transistor and a second amplifier stack transistor coupled in a differential configuration, and wherein a source terminal of the first amplifier stack transistor is coupled to the drain terminal of the first transistor of the amplifier and the drain terminal of the first current source transistor; and wherein a source terminal of the second amplifier stack transistor is coupled to the drain terminal of the second transistor of the amplifier and the drain terminal of the second current source.

18. The amplifier circuit of claim 17, wherein the amplifier stack is configured to receive an input control signal to control characteristics of the first transistor of the amplifier and the second transistor of the amplifier based on an envelope of the input signal.

19. The amplifier circuit of claim 16, further comprising a plurality of amplifier stacks comprising
 a first amplifier stack comprising the amplifier stack configured to provide an amplifier stack output signal, wherein the amplifier stack output signal comprises an amplifier stack direct current (DC) signal; and
 a second amplifier stack coupled to the amplifier stack and a second current source, the second source configured to
  receive a second electrical supply;
   divide the amplifier stack direct current (DC) signal of the amplifier stack output signal based on the electrical supply.

20. A mobile radio communication circuit comprising:
an up-converter configured to up-convert a baseband communication signal to a radio frequency (RF) communication signal; and
an amplifier configured to amplify an input signal comprising the radio frequency (RF) communication signal to provide an output signal, wherein the output signal comprises a direct current (DC) signal;
a current source coupled to the amplifier, the current source configured to
 receive an electrical supply;
 divide the direct current (DC) signal of the output signal based on the electrical supply, wherein the current source comprises a shunt circuit configured to partially shunt the DC signal of the output signal in which an amount of shunted DC signal is based on the electrical supply.

21. The mobile radio communication circuit of claim 20, wherein the current source is coupled to a voltage source to receive the electrical supply, and wherein the current source is configured to partially shunt the direct current (DC) signal of the output signal based on the input signal.

22. A mobile radio communication device comprising:
a mobile radio communication circuit comprising:
an up-converter configured to up-convert a baseband communication signal to a radio frequency (RF) communication signal; and
an amplifier circuit comprising:
 an amplifier configured to amplify an input signal comprising the radio frequency (RF) communication signal to provide an output signal, wherein the output signal comprises a direct current (DC) signal;
 a current source coupled to the amplifier, the current source configured to
  receive an electrical supply;
  divide the direct current (DC) signal of the output signal based on the electrical supply, wherein the current source comprises a shunt circuit configured to partially shunt the DC signal of the output signal in which an amount of shunted DC signal is based on the electrical supply;
an antenna configured to transmit an amplifier output signal provided by the amplifier circuit.

23. The mobile radio communication device of claim 22, further comprising:
a baseband processor configured to provide the baseband communication signal.

24. A method comprising:
receiving an input signal;
amplifying the input signal to provide an output signal comprising a direct current (DC) signal by an amplifier;
receiving an electrical supply by a current source;
dividing the direct current (DC) signal of the output signal by the current source based on the electrical supply, wherein the dividing the DC signal comprises partially shunting, by a shunt circuit, the DC signal of the output signal in which an amount of shunted DC signal is based on the electrical supply.

25. The method of claim 24, further comprising:
partially shunting the direct current (DC) signal of the output signal based on the input signal.

* * * * *